United States Patent
Kim et al.

(10) Patent No.: US 10,669,631 B2
(45) Date of Patent: Jun. 2, 2020

(54) GAS INJECTION APPARATUS AND THIN FILM DEPOSITION EQUIPMENT INCLUDING THE SAME

(71) Applicant: Samsung Electronics Co., Ltd., Suwon-si, Gyeonggi-do (KR)

(72) Inventors: Ki-Chul Kim, Seongnam-si (KR); Jung-Il Ahn, Suwon-si (KR); Jung-Hun Seo, Suwon-si (KR); Jong-Cheol Lee, Seoul (KR); Kyu-Hee Han, Suwon-si (KR); Seung-Han Lee, Osan-si (KR); Jin-Pil Heo, Pyeongtaek-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/031,349

(22) Filed: Jul. 10, 2018

(65) Prior Publication Data

US 2018/0320267 A1    Nov. 8, 2018

Related U.S. Application Data

(63) Continuation of application No. 14/835,082, filed on Aug. 25, 2015, now Pat. No. 10,041,172.

(30) Foreign Application Priority Data

Sep. 1, 2014    (KR) .......................... 10-2014-0115502

(51) Int. Cl.
C23C 16/40        (2006.01)
C23C 16/455       (2006.01)
C23C 16/44        (2006.01)

(52) U.S. Cl.
CPC .... *C23C 16/45574* (2013.01); *C23C 16/4412* (2013.01); *C23C 16/45519* (2013.01); *C23C 16/45551* (2013.01); *C23C 16/45565* (2013.01)

(58) Field of Classification Search
CPC ........ C23C 16/45574; C23C 16/45551; C23C 16/45519; C23C 16/4412; C23C 16/45565

(Continued)

(56) References Cited

U.S. PATENT DOCUMENTS 6,579,372 B2    6/2003    Park
8,465,592 B2    6/2013    Kato et al.

(Continued)

FOREIGN PATENT DOCUMENTS

KR    1020090021033    2/2009
KR    1020100022924    3/2010

(Continued)

*Primary Examiner* — Rudy Zervigon
(74) *Attorney, Agent, or Firm* — Myers Bigel, P.A.

(57) ABSTRACT

A gas injection apparatus, which can sequentially supply a substrate with at least two kinds of source gases reacting with each other in a container, and thin film deposition equipment including the gas injection apparatus, are provided. The gas injection apparatus includes a base plate, a first gas supply region protruding from the base plate, a second gas supply region protruding from the base plate and adjacent the first gas supply region, and a trench defined by a sidewall of the first gas supply region and a sidewall of the second gas supply region. The sidewall of the first gas supply region and the sidewall of the second gas supply region face each other and extend in a radial direction on the base plate.

10 Claims, 20 Drawing Sheets

(58) Field of Classification Search
USPC .................. 118/715; 156/345.33, 345.34
See application file for complete search history.

(56) References Cited

U.S. PATENT DOCUMENTS

| | | |
|---|---|---|
| 8,835,332 B2 | 9/2014 | Kato et al. |
| 2010/0055315 A1 | 3/2010 | Honma |
| 2010/0132615 A1 | 6/2010 | Kato et al. |
| 2010/0186669 A1* | 7/2010 | Shin .................. C23C 16/45546 118/719 |
| 2010/0190341 A1 | 7/2010 | Park et al. |
| 2011/0048326 A1 | 3/2011 | Kato et al. |
| 2011/0159188 A1 | 6/2011 | Kato et al. |
| 2012/0152171 A1 | 6/2012 | Lee et al. |
| 2013/0019801 A1 | 1/2013 | Honma |
| 2013/0042813 A1 | 2/2013 | Kato et al. |
| 2013/0047924 A1 | 2/2013 | Enomoto et al. |
| 2013/0061804 A1 | 3/2013 | Enomoto et al. |
| 2013/0230908 A1 | 9/2013 | Shoji et al. |
| 2014/0170859 A1 | 6/2014 | Yamawaku et al. |
| 2014/0242814 A1 | 8/2014 | Karakawa |
| 2015/0007774 A1 | 1/2015 | Iwasaki et al. |
| 2015/0126044 A1 | 5/2015 | Kato et al. |
| 2015/0240357 A1 | 8/2015 | Tachibana et al. |
| 2015/0279627 A1 | 10/2015 | Iwasaki et al. |
| 2015/0292087 A1 | 10/2015 | Karakawa |
| 2015/0315705 A1 | 11/2015 | Kumagai et al. |
| 2015/0329964 A1 | 11/2015 | Hane et al. |
| 2015/0361553 A1* | 12/2015 | Murakawa .......... C23C 16/4412 156/345.55 |
| 2016/0060759 A1 | 3/2016 | Kim et al. |
| 2016/0068952 A1 | 3/2016 | Sasaki |
| 2016/0289831 A1 | 10/2016 | Je et al. |
| 2016/0307748 A1 | 10/2016 | Saly |
| 2017/0009347 A1 | 1/2017 | Jang et al. |
| 2017/0092480 A1 | 3/2017 | Yi et al. |
| 2018/0002808 A1 | 1/2018 | Chung et al. |

FOREIGN PATENT DOCUMENTS

| | | |
|---|---|---|
| KR | 1020110008537 | 1/2011 |
| KR | 1020130075695 | 7/2013 |
| KR | 1020130032812 | 8/2013 |
| KR | 1020140041021 | 4/2014 |
| WO | WO 2006/042074 | 4/2006 |
| WO | WO 2008/100846 | 8/2008 |

* cited by examiner

GAS INJECTION APPARATUS AND THIN FILM DEPOSITION EQUIPMENT INCLUDING THE SAME

CROSS-REFERENCE TO RELATED APPLICATIONS

This application is a continuation of U.S. application Ser. No. 14/835,082, filed on Aug. 25, 2015, which application claims priority under 35 U.S.C. 119 from Korean Patent Application No. 10-2014-0115502, filed on Sep. 1, 2014, the entire contents of each of which are hereby incorporated by reference herein.

BACKGROUND

The present inventive concept relates to a gas injection apparatus and thin film deposition equipment including the same, and more particularly to a gas injection apparatus, which can sequentially supply a substrate with at least two kinds of source gases reacting with each other in a container, and thin film deposition equipment including the gas injection apparatus.

As a known thin film deposition process in a semiconductor manufacturing method, a first source gas is absorbed onto a surface of a substrate under vacuum and a supplied gas is converted into a second source gas to form a single-layered or multi-layered atomic or molecular layer(s) by a reaction of gases taking place on the substrate surface, which are performed multiple times, thereby allowing a thin film to grow on the substrate. This process is referred to as an atomic layer deposition (ALD) or a molecular layer deposition (MLD). Since a film thickness can be controlled according to the number of cycles with high accuracy and a layer in a plane demonstrates high uniformity, the ALD or MLD process is expected as a promising method for effectively coping with the thinning tendency of a semiconductor device.

As one of the thin film deposition methods, a process is being researched and examined, in which a source gas is supplied from an upper side of a substrate using a single type thin film deposition equipment having a gas shower head provided at a top center of a vacuum container and unreacted source gas and reaction byproducts are exhausted from a lower side of the container. According to this process, however, when the first source gas is converted into the second source gas and when the second source gas is converted into the first source gas vice versa, a relatively long time is taken in performing purging using a purge gas and a deposition time is prolonged due to several hundreds of purging cycles being performed. Accordingly, apparatuses and methods for achieving a high throughput are needed or required.

In order to solve the aforementioned problems, a thin film deposition apparatus is proposed, the thin film deposition apparatus configured and driven such that 4 sheets of wafers are equidistantly arranged on a substrate support (or a turntable), first source gas discharge nozzles and second source gas discharge nozzles are equidistantly arranged to face the substrate support in a rotating direction, separating gas nozzles are arranged between each of the nozzles, and the substrate support is horizontally rotated.

According to the turntable type ALD apparatus, purging of the first source gas and the second source gas and purging using the purge gas are not necessarily performed, thereby achieving a high throughput. Meanwhile, the first source gas and the second source gas are supplied to a vacuum container at the same time. Therefore, it is necessary to propose techniques for suppressing the first and second source gases from being intermixed and reacting with each other in the vacuum container.

SUMMARY

The present inventive concept provides a gas injection apparatus, which can increase a gas reaction area by minimizing an intermixing area of a first source gas, a second source gas and a purge gas used to suppress the first source gas and the second source gas from being intermixed.

The present inventive concept also provides thin film deposition equipment, which can increase a gas reaction area by minimizing an intermixing area of a first source gas, a second source gas and a purge gas used to suppress the first source gas and the second source gas from being intermixed.

These and other objects of the present inventive concept will be described in or be apparent from the following description of the preferred embodiments.

According to an aspect of the present inventive concept, there is provided a gas injection apparatus comprising a base plate, a first gas supply region protruding from the base plate, the first gas supply region having a fan-shaped lower surface, a second gas supply region protruding from the base plate and adjacent the first gas supply region, the second gas supply region having a fan-shaped lower surface, and a trench defined by a sidewall of the first gas supply region and a sidewall of the second gas supply region, wherein the sidewall of the first gas supply region and the sidewall of the second gas supply region face each other and extend in a radial direction on the base plate.

In some embodiments of the present inventive concept, the first gas supply region includes at least one first jet hole formed on its lower surface that is configured to spray a first gas, and the second gas supply region includes at least one second jet hole formed on its lower surface that is configured to spray a second gas.

In some embodiments of the present inventive concept, the first gas supply region includes a plurality of first jet holes with at least one first jet hole formed on the sidewall of the first gas supply region and the second gas supply region includes a plurality of second jet holes with at least one second jet hole formed on the sidewall of the second gas supply region.

In some embodiments of the present inventive concept, the gas injection apparatus may further comprise a plurality of third jet holes formed on a bottom surface of the trench. A first portion of the third jet holes is configured to spray the first gas and a second portion of the third jet holes is configured to spray the second gas.

In some embodiments of the present inventive concept, the first portion of the third jet holes is adjacent to the first gas supply region and the second portion of the third jet holes is adjacent to the second gas supply region.

In some embodiments of the present inventive concept, the sidewall of the first gas supply region includes a first upper sidewall, a first lower sidewall and a first connecting surface connecting the first upper sidewall and the first lower sidewall, the sidewall of the second gas supply region includes a second upper sidewall, a second lower sidewall and a second connecting surface connecting the second upper sidewall and the second lower sidewall. The sidewalls of the trench are defined by the first and second lower sidewalls, the first and second upper sidewalls and the first and second connecting surfaces. The first gas supply region includes a plurality of first jet holes configured to spray a first gas with at least one of the first jet holes formed on a lower surface of the first gas supply region, and the second gas supply region includes a plurality of second jet holes configured to spray a second gas with at least one of the second jet holes formed on a lower surface of the second gas supply region.

In some embodiments of the present inventive concept, at least one of the first jet holes is formed on the first connecting surface and at least one of the second jet holes is formed on the second connecting surface.

In some embodiments of the present inventive concept, the sidewall of the first gas supply region and the sidewall of the second gas supply region are formed stepwise.

In some embodiments of the present inventive concept, the sidewall of the first gas supply region defining the trench includes a first portion having a continuous slope and a second portion having a non-continuous slope, the sidewall of the second gas supply region defining the trench includes a third portion having a continuous slope and a fourth portion having a non-continuous slope. And, the first gas supply region includes a first jet hole formed on the lower surface of the first gas supply region that is configured to spray a first gas, and the second gas supply region includes a second jet hole formed on the lower surface of the second gas supply region that is configured to spray a second gas.

In some embodiments of the present inventive concept, the first gas supply region is configured to supply a source gas and the second gas supply region is configured to supply a purge gas.

In some embodiments of the present inventive concept, the bottom surface of the trench is defined by the base plate and is fan-shaped.

According to another aspect of the present inventive concept, there is provided a gas injection apparatus comprising a base plate, first to fourth gas supply regions protruding from the base plate and spaced apart from each other to be sequentially disposed in a circumferential direction on the base plate and each of the first to fourth gas supply regions having a fan-shaped lower surface, a central trench surrounded by the first to fourth gas supply regions and having a bottom surface defined by the base plate, and first to fourth trenches extending from the central trench in a radial direction on the base plate, wherein the first trench is defined by a sidewall of the first gas supply region and a sidewall of the second gas supply region, the second trench is defined by a sidewall of the second gas supply region and a sidewall of the third gas supply region, the third trench is defined by a sidewall of the third gas supply region and a sidewall of the fourth gas supply region, and the fourth trench is defined by a sidewall of the fourth gas supply region and a sidewall of the first gas supply region.

In some embodiments of the present inventive concept, each of the first to fourth trenches is directly connected to the central trench.

In some embodiments of the present inventive concept, the central trench and the first to fourth trenches are connected in the shape of a pinwheel.

In some embodiments of the present inventive concept, the gas injection apparatus may further comprise an outer trench formed in a circumferential direction on the base plate. The first to fourth trenches are directly connected to the central trench and the outer trench.

In some embodiments of the present inventive concept, a depth of each of the first to fourth trenches is greater than that of the central trench.

In some embodiments of the present inventive concept, a depth of each of the first to fourth trenches is substantially equal to that of the central trench.

In some embodiments of the present inventive concept, a bottom surface of each of the first to fourth trenches is defined by the base plate.

In some embodiments of the present inventive concept, the gas injection apparatus may further comprise a central jet hole formed on a bottom surface of the central trench. The central jet hole is configured to spray a curtain gas.

In some embodiments of the present inventive concept, each of the first gas supply region and the third gas supply region is configured to spray a source gas and each of the second gas supply region and the fourth gas supply region sprays a purge gas.

In some embodiments of the present inventive concept, the first gas supply region includes a plurality of first jet holes that are configured to spray a first gas with at least one of the first jet holes formed on the lower surface of the first gas supply region, the second gas supply region includes a plurality of second jet holes that are configured to spray a second gas with at least one of the second jet holes formed on the lower surface of the second gas supply region, the third gas supply region includes a plurality of third jet holes that are configured to spray a third gas with at least one of the third jet holes formed on the lower surface of the third gas supply region, and the fourth gas supply region includes a plurality of fourth jet holes that are configured to spray a fourth gas with at least one of the fourth jet holes formed on the lower surface of the fourth gas supply region.

In some embodiments of the present inventive concept, at least one of each of the first to fourth jet holes are formed on sidewalls of the first to fourth gas supply regions, respectively.

According to still another aspect of the present inventive concept, there is provided thin film deposition equipment comprising a vacuum chamber including an upper plate and a chamber body, the upper plate including a gas injection apparatus, and a susceptor rotatably installed in the vacuum chamber, the susceptor having an upper surface including a substrate loading portion, wherein the upper plate includes a base plate facing the susceptor, the base plate including a lower surface facing the upper surface of the susceptor, a first gas supply region protruding from the lower surface of the base plate and configured to supply a first source gas to the upper surface of the susceptor, a second gas supply region protruding from the lower surface of the base plate and configured to supply a purge gas to the upper surface of the susceptor, a third gas supply region protruding from the lower surface of the base plate and configured to supply a second source gas to the upper surface of the susceptor, a fourth gas supply region protruding from the lower surface of the base plate and configured to supply the purge gas to the upper surface of the susceptor, a first trench defined by a sidewall of the first gas supply region and a sidewall of the second gas supply region, a second trench defined by a sidewall of the second gas supply region and a sidewall of the third gas supply region, a third trench defined by a sidewall of the third gas supply region and a sidewall of the fourth gas supply region, and a fourth trench defined by a sidewall of the fourth gas supply region and a sidewall of the first gas supply region, wherein the first to fourth gas supply regions are sequentially disposed in a circumferential direction on the base plate and the first to fourth trenches are elongated in a radial direction on the base plate.

In some embodiments of the present inventive concept, the susceptor includes a centrally protruding core unit, the upper plate includes a central trench surrounded by the first to fourth gas supply regions and having a bottom surface defined by the base plate, and the core unit is received in the central trench.

In some embodiments of the present inventive concept, the first to fourth trenches are directly connected to the central trench.

In some embodiments of the present inventive concept, bottom surfaces of the first to fourth trenches and the bottom surface of the central trench are coplanar.

In some embodiments of the present inventive concept, the bottom surfaces of the first to fourth trenches are recessed or offset from the bottom surface of the central trench.

In some embodiments of the present inventive concept, the upper plate further includes a central jet hole formed on the bottom surface of the central trench and the central jet hole configured to supply a curtain gas for preventing the first source gas and the second source gas from being intermixed.

In some embodiments of the present inventive concept, flow rates of the first source gas and the purge gas between the first gas supply region and the upper surface of the susceptor are lower than flow rates of the first source gas and the purge gas in the first trench and the fourth trench.

In some embodiments of the present inventive concept, pressures of the first source gas and the purge gas between the first gas supply region and the upper surface of the susceptor are higher than pressures of the first source gas and the purge gas in the first trench and the fourth trench.

In some embodiments of the present inventive concept, the first gas supply region includes at least one first jet hole, the second gas supply region includes at least one second jet hole, the third gas supply region includes at least one third jet hole, and the fourth gas supply region includes at least one fourth jet hole.

In some embodiments of the present inventive concept, at least one of each of the first to fourth jet holes are formed on sidewalls of the first to fourth gas supply regions, respectively.

In some embodiments of the present inventive concept, the upper plate further includes a first trench jet hole formed on the bottom surface of the first trench, a second trench jet hole formed on the bottom surface of the second trench, a third trench jet hole formed on the bottom surface of the third trench, and a fourth trench jet hole formed on the bottom surface of the fourth trench. And, the first trench jet hole and the fourth trench jet hole are configured to jet the first source gas and the purge gas, respectively, and the second trench jet hole and the third trench jet hole are configured to jet the second source gas and the purge gas, respectively.

In some embodiments of the present inventive concept, the thin film deposition equipment may further comprise a first pumping port and a second pumping port disposed in the chamber body and disposed around the susceptor. The first gas supply region is configured to spray the first source gas, the third gas supply region is configured to spray the second source gas, and the first pumping port is configured to absorb the first source gas and the second pumping port is configured to absorb the second source gas.

According to a further aspect of the present inventive concept, there is provided thin film deposition equipment comprising a vacuum chamber including an upper plate and a container body, and a susceptor rotatably installed in the vacuum chamber and an upper surface including a substrate loading portion, wherein the upper plate includes a base plate facing the susceptor and including a lower surface facing the upper surface of the susceptor, first to fourth protruding regions that protrude from the lower surface of the base plate and that are sequentially disposed in a circumferential direction on the base plate, a first gas port disposed at a sidewall of the container body that is configured to supply a first source gas to a space between the first protruding region and the susceptor, a second gas port disposed at a sidewall of the container body that is configured to supply a purge gas to a space between the second protruding region and the susceptor, a third gas port disposed at a sidewall of the container body that is configured to supply a second source gas to a space between the third protruding region and the susceptor, a fourth gas port disposed at a sidewall of the container body that is configured to supply the purge gas to a space between the second protruding region and the susceptor, a first trench defined by a sidewall of the first protruding region and a sidewall of the second protruding region, a second trench defined by a sidewall of the second protruding region and a sidewall of the third protruding region, a third trench defined by a sidewall of the third protruding region and a sidewall of the fourth protruding region, and a fourth trench defined by a sidewall of the fourth protruding region and a sidewall of the first protruding region, wherein the first to fourth trenches are elongated in a radial direction on the base plate.

In some embodiments of the present inventive concept, the thin film deposition equipment may further comprise a first jet hole formed on a lower surface of the first protruding region and configured to supply the first source gas, a second jet hole formed on a lower surface of the second gas supply region and configured to supply the purge gas, a third jet hole formed on a lower surface of the third protruding region and configured to supply the second source gas, and a fourth jet hole formed on a lower surface of the fourth protruding region and configured to supply the purge gas.

In some embodiments of the present inventive concept, a first pumping port and a second pumping port are disposed in the container body and disposed around an outer periphery of the susceptor. The first pumping port may be configured to absorb the first source gas and the second pumping port may be configured to absorb the second source gas.

According to a further aspect of the present inventive concept, there is provided a gas injection apparatus including a base plate, a first gas supply member extending downwardly away from the base plate, and a second gas supply member extending downwardly from the base plate adjacent the first gas supply member. A first trench is defined by a first sidewall of the first gas supply member and a first sidewall of the second gas supply member, wherein the first sidewall of the first gas supply member and the first sidewall of the second gas supply region face each other and extend in a radial direction on the base plate. A plurality of first jet holes defined in the first gas supply member, with the plurality of first jet holes configured to spray a first source gas. A plurality of second jet holes defined in the second gas supply member, with the plurality of second jet holes configured to spray a purge gas.

In some embodiments of the present inventive concept, at least some of the plurality of first jet holes are defined in a lower surface of the first gas supply member and at least some of the plurality of second jet holes are defined in a lower surface of the second gas supply member.

In some embodiments of the present inventive concept, at least some of the plurality of first jet holes are defined in the first sidewall of the first gas supply member and at least some of the plurality of second jet holes are defined in the first sidewall of the second gas supply member.

In some embodiments of the present inventive concept, the apparatus includes: a third gas supply member extending downwardly away from the base plate adjacent the second gas supply member; a fourth gas supply member extending downwardly from the base plate adjacent the third gas supply member; a central trench surrounded by the first to fourth gas supply members and having a bottom surface defined by the base plate; a second trench defined by a second sidewall of the second gas supply member and a first sidewall of the third gas supply member, wherein the second sidewall of the second gas supply member and the first sidewall of the third gas supply member face each other and extend away from the central trench in a radial direction on the base plate; a third trench defined by a second sidewall of the third gas supply member and a first sidewall of the fourth gas supply member, wherein the second sidewall of the third gas supply member and the first sidewall of the fourth gas supply member face each other and extend away from the central trench in a radial direction on the base plate; a fourth trench defined by a second sidewall of the fourth gas supply member and a second sidewall of the first gas supply member, wherein the second sidewall of the fourth gas supply member and the second sidewall of the first gas supply member face each other and extend away from the central trench in a radial direction on the base plate; a plurality of third jet holes defined in the third gas supply member, the plurality of third jet holes configured to spray a second source gas; and a plurality of fourth jet holes defined in the fourth gas supply member, the plurality of fourth jet holes configured to spray the purge gas.

BRIEF DESCRIPTION OF THE DRAWINGS

The above and other features and advantages of the present inventive concept will become more apparent by describing in detail preferred embodiments thereof with reference to the attached drawings in which.

DETAILED DESCRIPTION OF THE EMBODIMENTS

Figure 1:
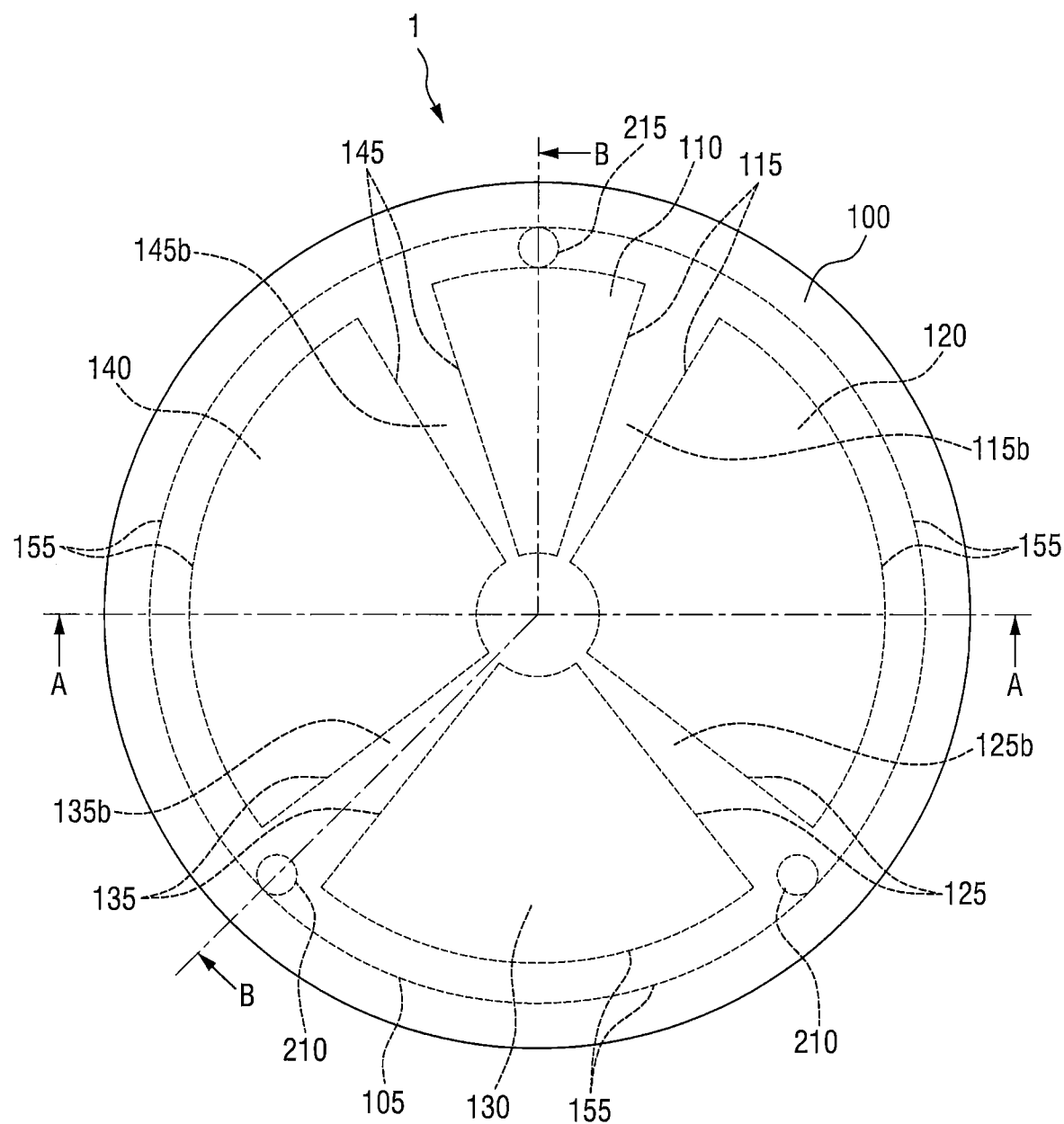
FIG. 1 is a schematic top view illustrating thin film deposition equipment according to an embodiment of the present inventive concept.

The present inventive concept will now be described more fully hereinafter with reference to the accompanying drawings, in which preferred embodiments of the inventive concept are shown. This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. In the attached figures, the thickness of layers and regions may be exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when an element or layer is referred to as being "on" another element or layer, it can be directly on the other element or layer, or intervening elements or layers may also be present. In contrast, when an element or layer is referred to as being "directly on" another element or layer, there are no intervening elements or layers present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Unless defined otherwise, all technical and scientific terms used herein have the same meaning as commonly understood by one of ordinary skill in the art to which this inventive concept belongs. It is noted that the use of any and all examples, or exemplary terms provided herein is intended merely to better illustrate the inventive concept and is not a limitation on the scope of the inventive concept unless otherwise specified. Further, unless defined otherwise, all terms defined in generally used dictionaries are not to be overly interpreted.

Figure 4:
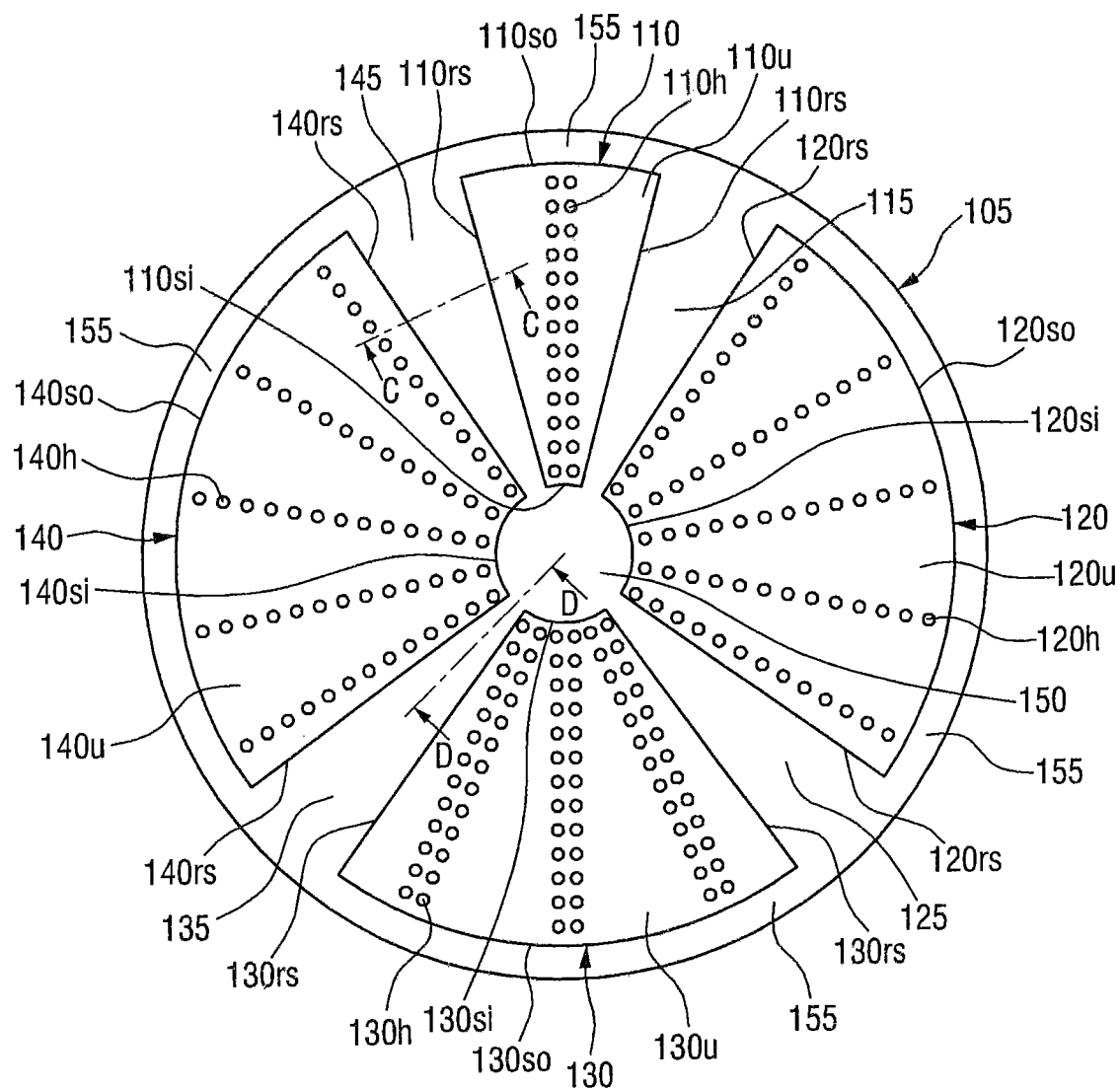
FIG. 4 is a top view illustrating an exemplary gas injection apparatus used in thin film deposition equipment according to embodiments of the present inventive concept.
Figure 5:
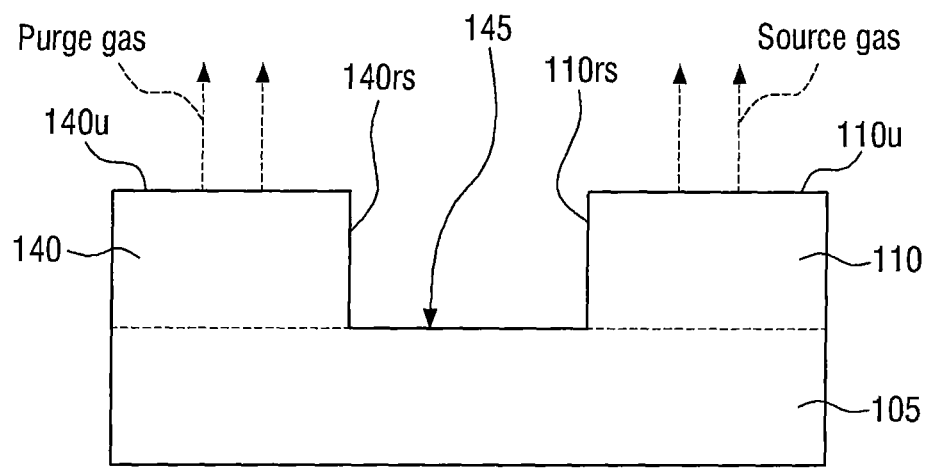
FIG. 5 is a cross-sectional view taken along the line C-C of FIG. 4.
Figure 7:
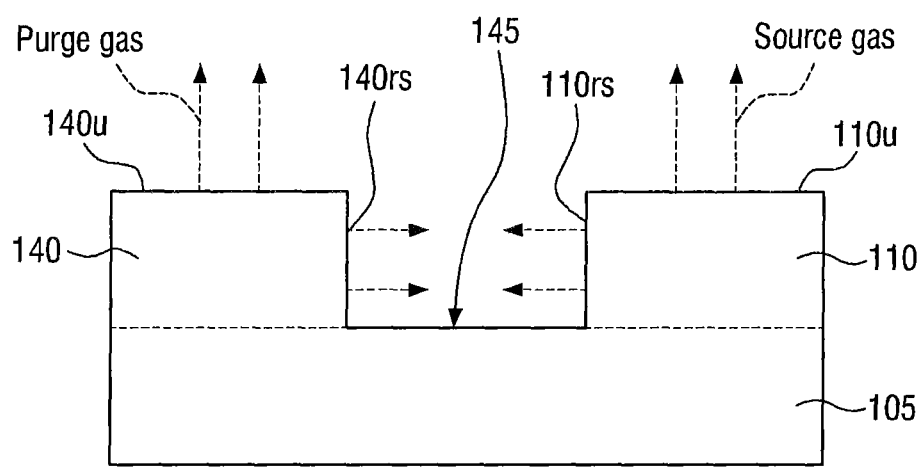
FIG. 7 is a cross-sectional view illustrating another exemplary gas injection apparatus used in thin film deposition equipment according to embodiments of the present inventive concept.
Figure 8:
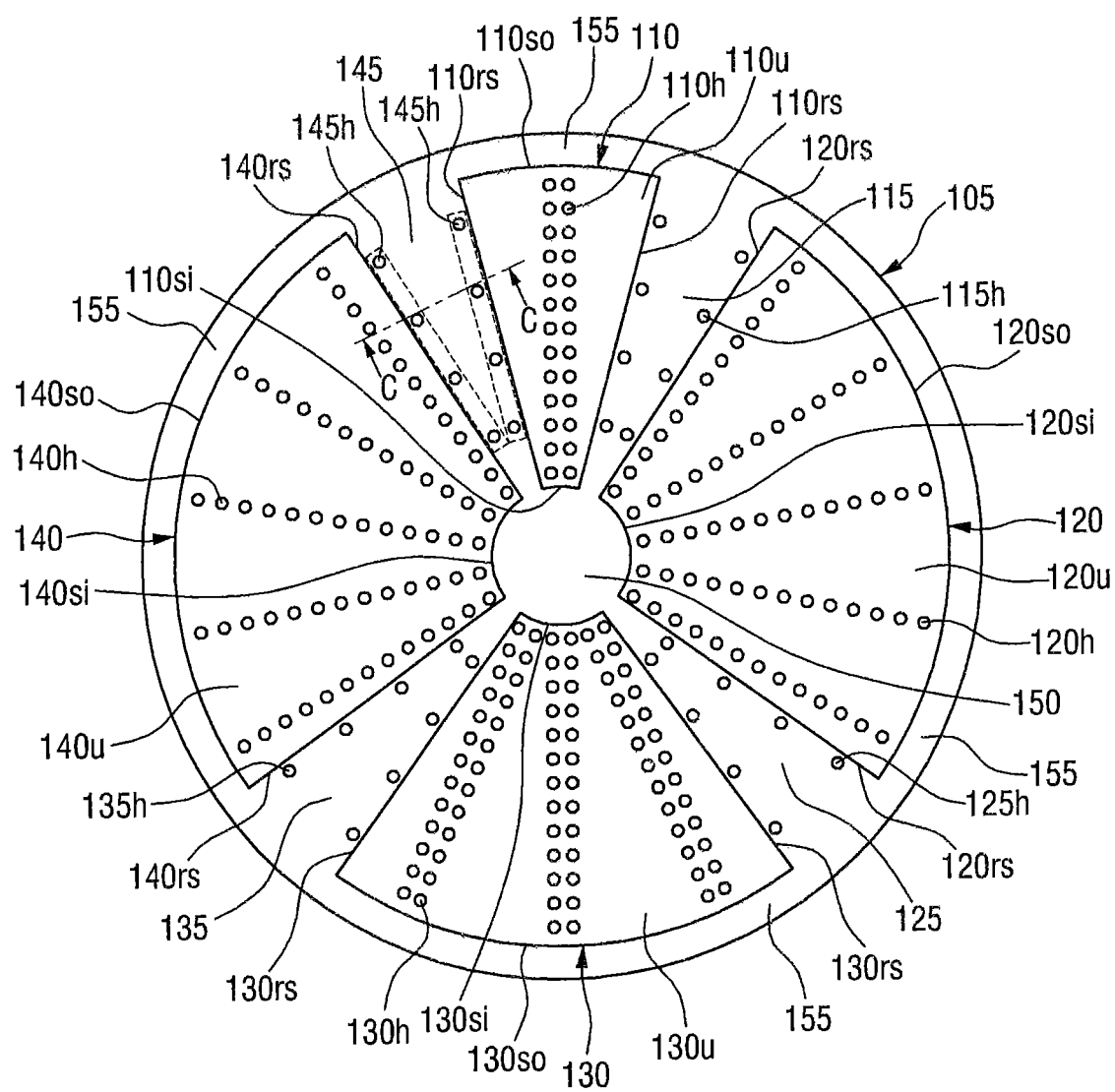
FIG. 8 is a top view illustrating still another exemplary gas injection apparatus used in thin film deposition equipment according to embodiments of the present inventive concept.
Figure 9:
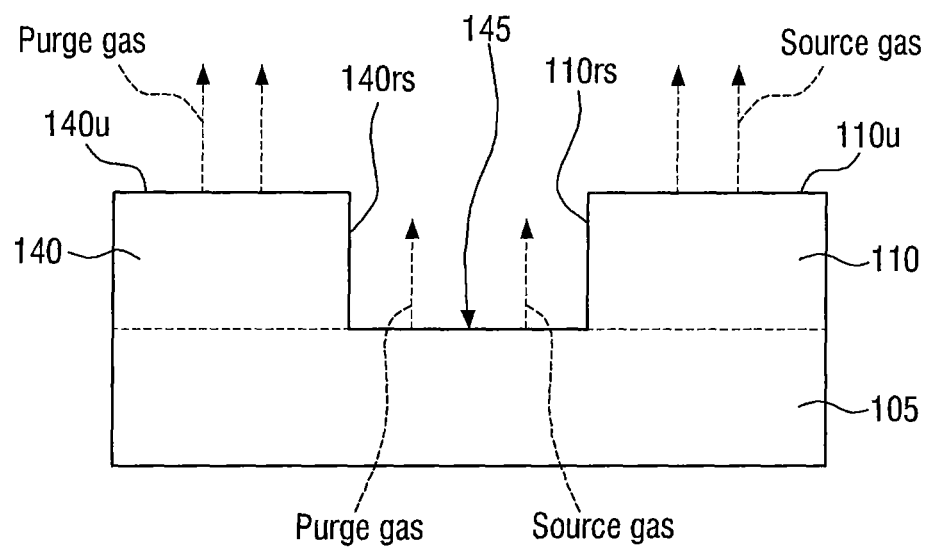
FIG. 9 is a cross-sectional view taken along the line C-C of FIG. 8.
Figure 10:
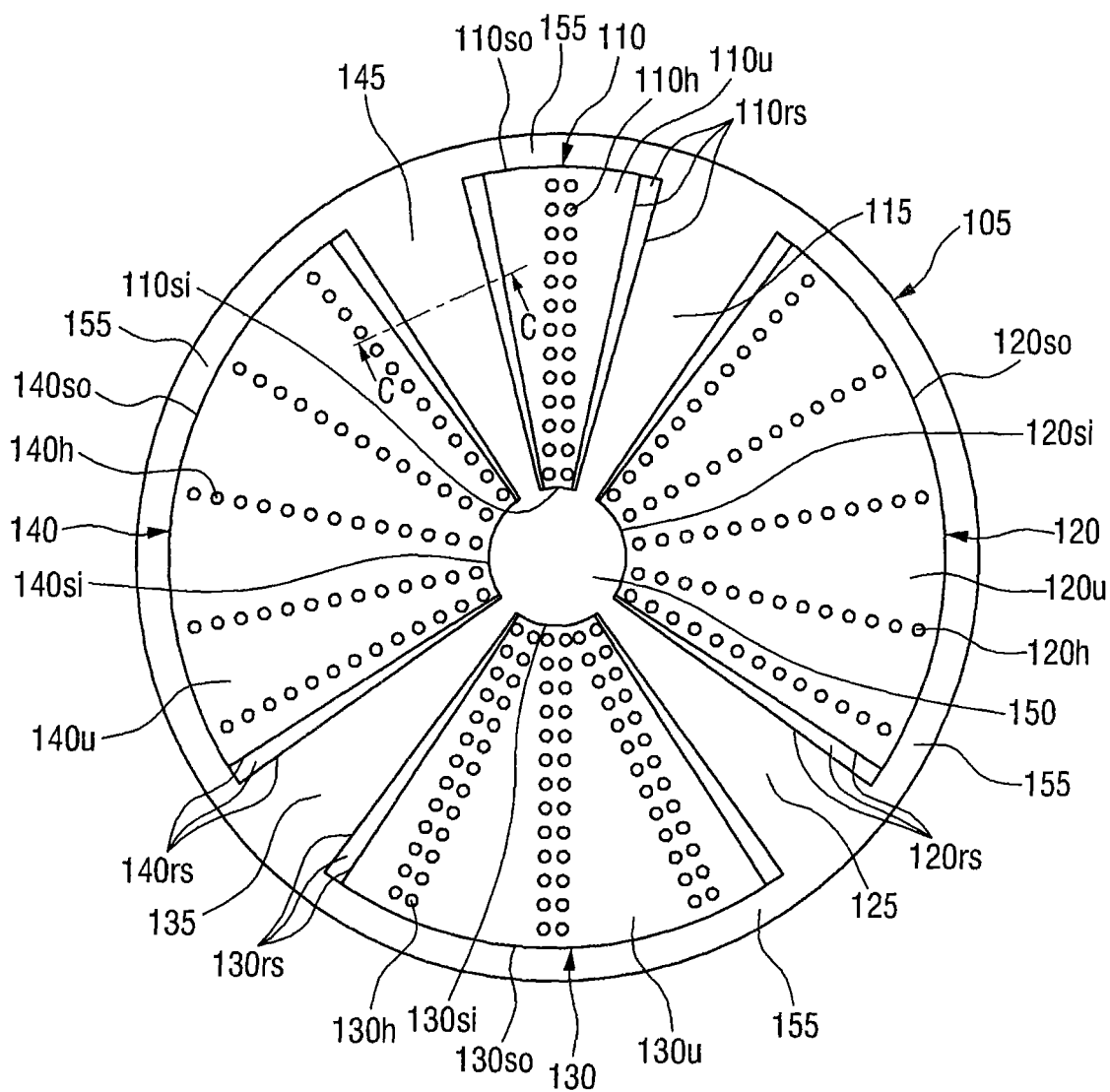
FIG. 10 is a top view illustrating still another exemplary gas injection apparatus used in thin film deposition equipment according to embodiments of the present inventive concept.
Figure 11:
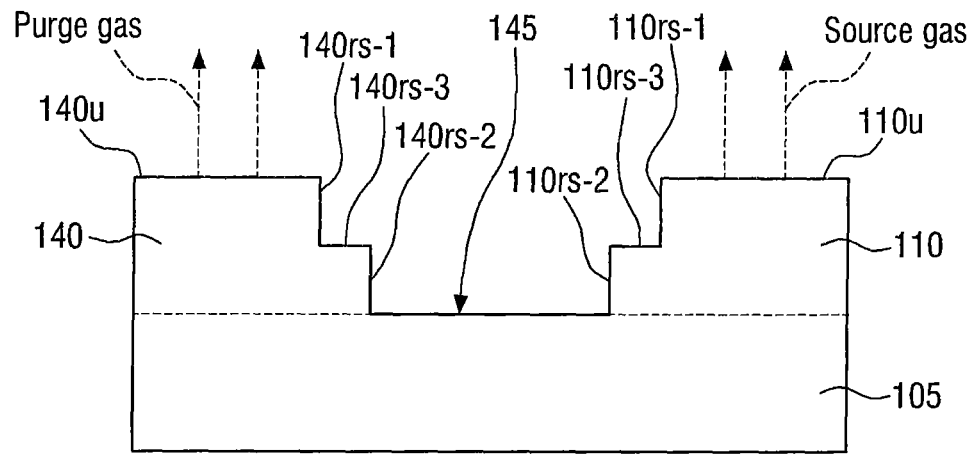
FIG. 11 is a cross-sectional view taken along the line C-C of FIG. 10 according to some embodiments.
Figure 12:
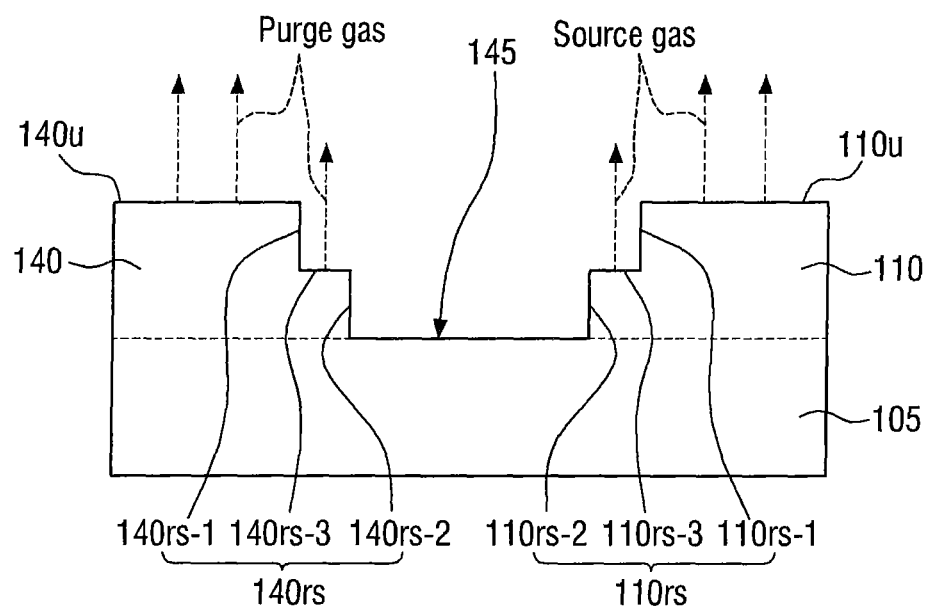
FIG. 12 is a cross-sectional view taken along the line C-C of FIG. 10 according to some other embodiments.
Figure 13:
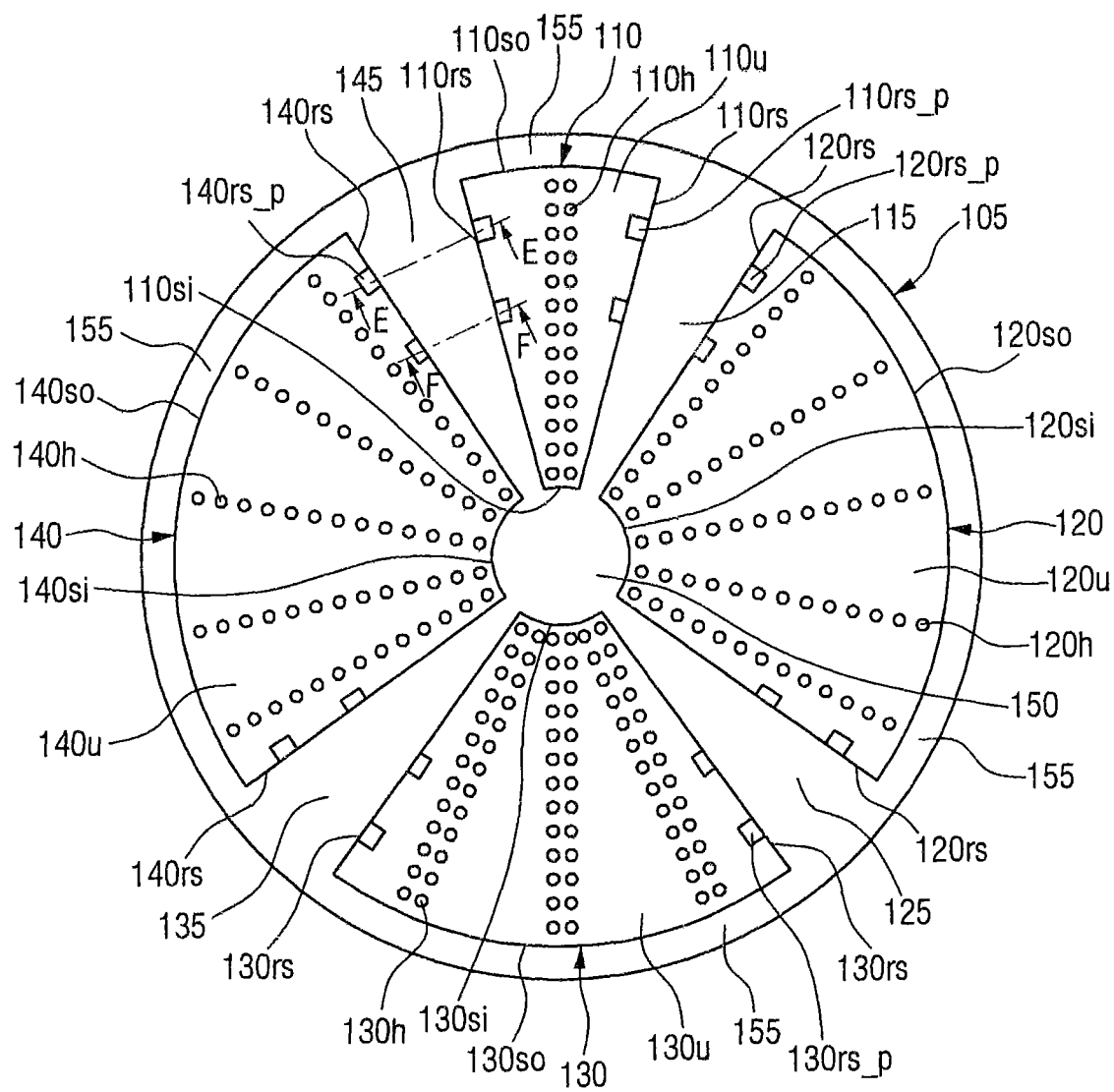
FIG. 13 is a top view illustrating still another exemplary gas injection apparatus used in thin film deposition equipment according to embodiments of the present inventive concept.

Hereinafter, thin film deposition equipment according to embodiments of the present inventive concept will be described with reference to FIGS. 1 to 14. FIG. 1 is a schematic top view for explaining thin film deposition equipment according to an embodiment of the present inventive concept, FIG. 2 is a cross-sectional view taken along the line A-A of FIG. 1, FIG. 3 is a cross-sectional view taken along the line B-B of FIG. 1, FIG. 4 is a top view for explaining an exemplary gas injection apparatus used in thin film deposition equipment according to embodiments of the present inventive concept, FIGS. 5 and 6 are cross-sectional views taken along the lines C-C and D-D of FIG. 4, FIG. 7 is a cross-sectional view for explaining another exemplary gas injection apparatus used in thin film deposition equipment according to embodiments of the present inventive concept, FIGS. 8 and 9 illustrate still another exemplary gas injection apparatus used in thin film deposition equipment according to embodiments of the present inventive concept, FIGS. 10 and 11 illustrate still another exemplary gas injection apparatus used in thin film deposition equipment according to embodiments of the present inventive concept, FIG. 12 is a cross-sectional view for explaining still another exemplary gas injection apparatus used in thin film deposition equipment according to embodiments of the present inventive concept, and FIGS. 13 and 14 illustrate still another exemplary gas injection apparatus used in thin film deposition equipment according to embodiments of the present inventive concept.

Figure 2:
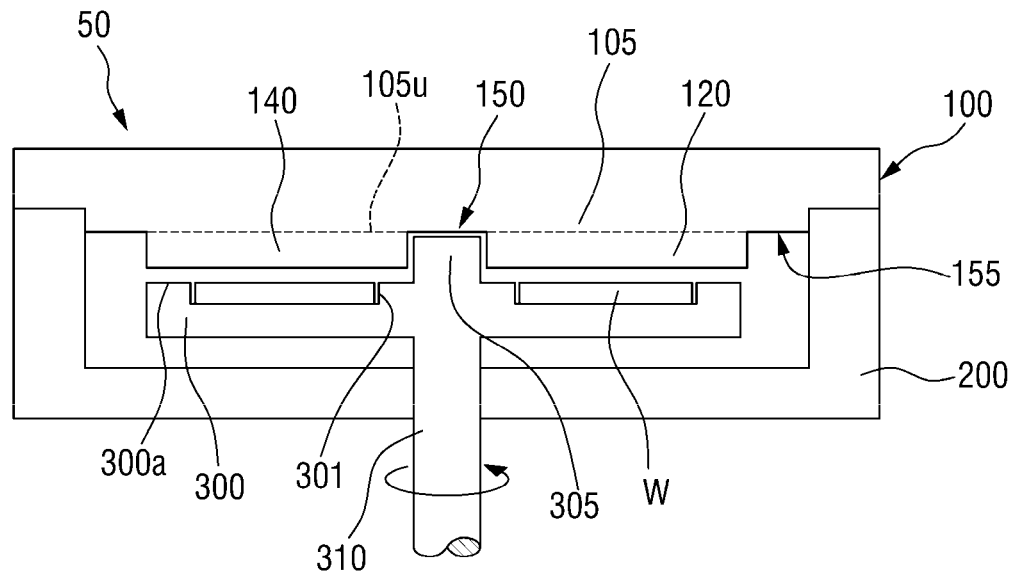
FIG. 2 is a cross-sectional view taken along the line A-A of FIG. 1.
Figure 3:
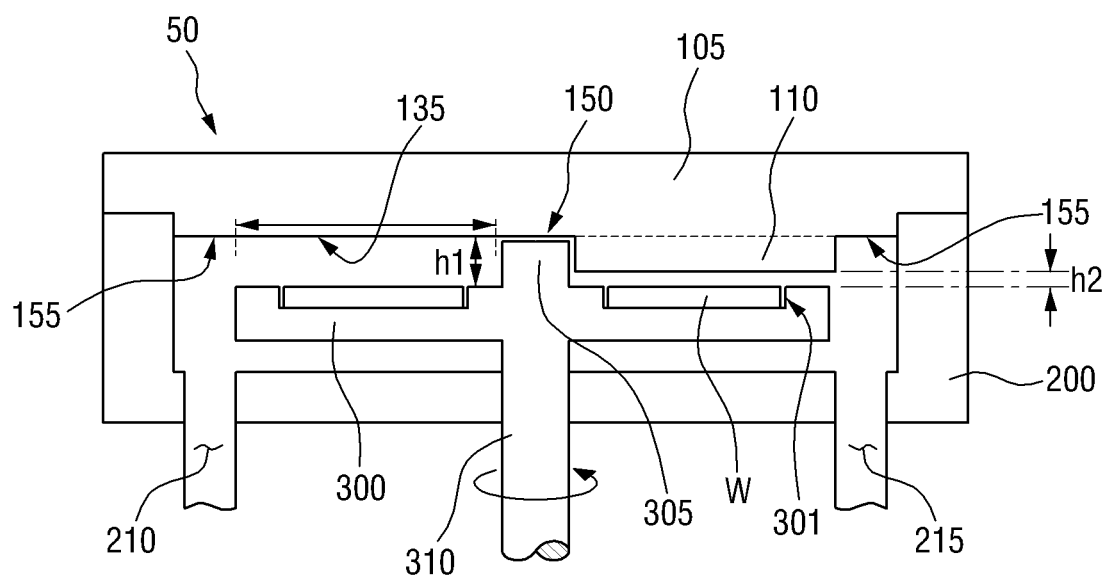
FIG. 3 is a cross-sectional view taken along the line B-B of FIG. 1.

Referring to FIGS. 1 to 3, the thin film deposition equipment 1 according to an embodiment of the present inventive concept includes a vacuum chamber 50 and a susceptor 300.

The vacuum chamber 50 may be substantially circular. The vacuum chamber 50 may include a panel-shaped upper plate 100 and a circular container body 200. The shapes of the upper plate 100 and the container body 200 are provided only for the sake of convenient explanation, but aspects of the present inventive concept are not limited thereto.

In the vacuum chamber 50, the upper plate 100 and the container or chamber body 200 are configured to be separated from each other. The upper plate 100 is attached or connected to the container body 200 and may be sealed by, for example, an O-ring, thereby hermetically sealing the vacuum chamber 50 in a closed or vacuum state. When the upper plate 100 is separated from the container body 200, it may be lifted upwardly by driving mechanism disposed in the outer part of a base plate 105 portion of the upper plate 100.

The upper plate 100 and the container body 200 may be formed using, for example, a corrosion-resistant metal. Since a source gas used in a thin film deposition process may include a corrosive material, the corrosion-resistant metal may be used, but aspects of the present inventive concept are not limited thereto.

The susceptor 300 may be disposed within the vacuum chamber 50. The susceptor 300 may have a rotation center or rotational axis at or through the center of the vacuum chamber 50 and may rotate about the rotation center. That is to say, the susceptor 300 may be rotatably installed within the vacuum chamber 50.

The susceptor 300 may include a centrally protruding core unit 305. The core unit 305 may protrude from an upper surface 300a of the susceptor 300.

The susceptor 300 may include a substrate loading part or portion 301. The substrate loading part 301 may be formed on the upper surface 300a of the susceptor 300. That is to say, the upper surface 300a of the susceptor 300 may include the substrate loading part 301. The susceptor 300 may include a plurality of substrate loading parts 301, which may be arranged along the periphery of the core unit 305 in a regular interval, but aspects of the present inventive concept are not limited thereto.

The substrate loading part 301 may be formed on the upper surface 300a of the susceptor 300. The substrate loading part 301 may have a circular shape. The substrate loading part 301 may be recessed in the upper surface 300a of the susceptor 300. The substrate loading part 301 may be recessed to prevent a substrate W from deviating or moving from the substrate loading part 301 while the susceptor 300 is being rotated.

The susceptor 300 is connected to a rotation member 310 vertically extending and configured to perform a rotating motion. The rotation member 310 may be connected to a rotation driver after passing through a lower portion of the container body 200.

In FIGS. 2 and 3, the susceptor 300 including only the substrate loading part 301 for mounting the substrate W is illustrated, but aspects of the present incentive concept are not limited thereto. That is to say, a heating element for adjusting a temperature of the substrate W to a deposition temperature for depositing a thin film on the substrate W may be provided in the susceptor 300.

In more detail, the upper plate 100 may include a gas injection apparatus including a base plate or base plate portion 105 and first to fourth gas supply regions or members 110, 120, 130 and 140.

The base plate 105 may be disposed to face the susceptor 300. A lower surface of the base plate 105 faces the upper surface 300a of the susceptor 300.

The first gas supply region 110 may protrude from the lower surface of the base plate 105 and may supply a first source gas as the source gas to the upper surface 300a of the susceptor 300. That is to say, the first gas supply region 110 may supply the first source gas to the substrate W.

The third gas supply region 130 may protrude from the lower surface of the base plate 105 and may supply a second source gas as the source gas to the upper surface 300a of the susceptor 300. That is to say, the third gas supply region 130 may supply the second source gas to the substrate W.

The second gas supply region 120 and the fourth gas supply region 140 may protrude from the lower surface of the base plate 105 and may supply a purge gas to the upper surface 300a of the susceptor 300.

The second gas supply region 120 and the fourth gas supply region 140 may serve to exhaust the first source gas or the second source gas that is not attached to the substrate W to the outside and may serve as a barrier or fence for preventing the first source gas and the second source gas from being intermixed.

Although not shown in FIG. 1, the first gas supply region 110 is connected to a gas port for supplying the first source gas, the second gas supply region 120 and the fourth gas supply region 140 are connected to a gas port for supplying the purge gas, and the third gas supply region 130 is connected to a gas port for supplying the second source gas.

In the following description, in the interest of brevity, the first source gas may be, for example, a metal precursor, and the second source gas may be, for example, a non-metal source gas reacting with the metal precursor.

The first to fourth gas supply regions 110, 120, 130 and 140 may be sequentially disposed in a rotating direction of the susceptor 300 or a circumferential direction on the base plate 105. That is to say, the second gas supply region 120 and the fourth gas supply region 140 supplying the purge gas may be disposed between the first gas supply region 110 and the third gas supply region 130, respectively.

In addition, the first to fourth gas supply regions 110, 120, 130 and 140 are disposed to be spaced apart from each other.

A first trench 115 is disposed between the first gas supply region 110 and the second gas supply region 120. In more detail, the first trench 115 is defined by a sidewall of the first gas supply region 110 and a sidewall of the second gas supply region 120, which will later be described in detail with reference to FIGS. 4 and 5.

A second trench 125 is disposed between the second gas supply region 120 and the third gas supply region 130, a third trench 135 is disposed between the third gas supply region 130 and the fourth gas supply region 140, and a fourth trench 145 is disposed between the fourth gas supply region 140 and the first gas supply region 110.

The first to fourth trenches 115, 125, 135 and 145 may be shaped to be elongated in a radial direction on the base plate 105.

In addition, since lower surfaces of the first to fourth gas supply regions 110, 120, 130 and 140 protrude from the lower surface 105u of the base plate 105 and bottom or base surfaces 115b, 125b, 135b and 145b of the first to fourth trenches 115, 125, 135 and 145 correspond to the lower surface 105u of the base plate 105, there are step differences between the respective lower surfaces of the first to fourth gas supply regions 110, 120, 130 and 140 and the respective bottom surfaces 115b, 125b, 135b and 145b of the first to fourth trenches 115, 125, 135 and 145.

For example, in FIG. 3, a height h1 ranging from the upper surface 300a of the susceptor 300 to a bottom surface of the third trench 135 is greater than a height h2 ranging from the upper surface 300a of the susceptor 300 to a lower surface of the first gas supply region 110. That is to say, a distance (i.e., the height h2) between the susceptor 300 and the first gas supply region 110 supplying the first source gas to the substrate W is smaller than the height h1 ranging from the upper surface 300a of the susceptor 300 to the bottom surface of the third trench 135.

The upper plate 100 includes a central trench 150 surrounded by the first to fourth gas supply regions 110, 120, 130 and 140 and including a bottom or base surface defined by the lower surface of the base plate 105. The central trench 150 may have a circular shape.

The central trench 150 may be positioned to correspond to the core unit 305 of the susceptor 300. That is to say, a portion of the core unit 305 may be inserted into or received in the central trench 150.

In FIGS. 1 and 3, a first pumping port 215 and a second pumping port 210 disposed at a lower portion of the container body 200 are illustrated, which is, however, provided only for the sake of convenient explanation, but aspects of the present inventive concept are not limited thereto. That is to say, the first pumping port 215 and the second pumping port 210 may be disposed at a side of the container body 200 or may be disposed in the upper plate 100.

The first pumping port 215 and the second pumping port 210 are disposed around the susceptor 300 to exhaust the source gas supplied to the substrate W to the outside. That is to say, the first source gas and the second source gas as source gases for thin film deposition may be absorbed through the first pumping port 215 and the second pumping port 210. For example, when the thin film deposition equipment 1 according to an embodiment of the present inventive concept is an equipment for depositing ZrO, a Zr precursor and a reaction gas including oxygen (e.g., $O_3$) remaining after ZrO is deposited on the substrate W may be exhausted to the outside through the first pumping port 215 and the second pumping port 210.

In addition, although not shown, the first pumping port 215 and the second pumping port 210 may be connected to different pumps. When the first source gas and the second source gas used for thin film deposition are absorbed using the same pump, a reaction between the first source gas and the second source gas may take place in the pump, so that particles may accumulate in the pump, causing malfunctions.

An example of the gas injection apparatus used in thin film deposition equipment according to embodiments of the present inventive concept will now be described with reference to FIGS. 4 to 6.

Referring to FIGS. 4 to 6, the gas injection apparatus may include a base plate 105, a first gas supply region 110, a second gas supply region 120, a third gas supply region 130, and a fourth gas supply region 140.

The first to fourth gas supply regions 110, 120, 130 and 140 protrude from the lower surface of the base plate 105. The first to fourth gas supply regions 110, 120, 130 and 140 are spaced apart from each other. The first to fourth gas supply regions 110, 120, 130 and 140 may be sequentially disposed in a circumferential direction on the base plate 105, that is, in a rotating direction of the susceptor 300 in FIG. 2.

The first gas supply region 110 includes an inner sidewall 110si and an outer sidewall 110so formed in a circumferential direction and two radial sidewalls 110rs extending in a radial direction on the base plate 105. In addition, the first gas supply region 110 has a lower surface 110u in the shape of a fan.

The first gas supply region 110 includes at least one first jet hole or aperture 110h formed on its lower surface 110u. The first jet hole 110h supplies the first source gas supplied to the first gas supply region 110 to the substrate W.

The second gas supply region 120 includes an inner sidewall 120si and an outer sidewall 120so formed in a circumferential direction and two radial sidewalls 120rs extending in a radial direction. In addition, the second gas supply region 120 has a lower surface 120u in the shape of a fan.

The second gas supply region 120 includes at least one second jet hole or aperture 120h formed on its lower surface 120u. The second jet hole 120h supplies the purge gas supplied to the second gas supply region 120 to the substrate W.

The third gas supply region 130 includes an inner sidewall 130si and an outer sidewall 130so formed in a circumferential direction and two radial sidewalls 130rs extending in a radial direction. In addition, the third gas supply region 130 has a lower surface 130u in the shape of a fan.

The third gas supply region 130 includes at least one third jet hole or aperture 130h formed on its lower surface 130u. The third jet hole 130h supplies the second source gas supplied to the third gas supply region 130 to the substrate W.

The fourth gas supply region 140 includes an inner sidewall 140si and an outer sidewall 140so formed in a circumferential direction and two radial sidewalls 140rs extending in a radial direction. In addition, the fourth gas supply region 140 has a lower surface 140u in the shape of a fan.

The fourth gas supply region 140 includes at least one fourth jet hole or aperture 140h formed on its lower surface 140u. The fourth jet hole 140h supplies the purge gas supplied to the fourth gas supply region 140 to the substrate W.

The first trench 115 is defined by the radial sidewalls 110rs and 120rs of the first and second gas supply regions 110 and 120, facing each other and extending in a radial direction.

Likewise, the second trench 125, the third trench 135 and the fourth trench 145 are respectively defined by the radial sidewalls 110rs of the first gas supply regions 110, the radial sidewalls 120rs of the second gas supply regions 120, the radial sidewalls 130rs of the third gas supply regions 130 of the third gas supply region 130 and the radial sidewalls 140rs of the fourth gas supply region 140, facing each other and extending in a radial direction.

A bottom or base surface of the first trench 115 may be defined by the lower surface of the base plate 105. In addition, each of bottom or base surfaces of the second to fourth trenches 125, 135 and 145 may also be defined by the lower surface of the base plate 105.

Each of the bottom surfaces of the first to fourth trenches 115, 125, 135 and 145 may have the shape of, for example, a fan.

Each of the first to fourth trenches 115, 125, 135 and 145 may be elongated in a radial direction on the base plate 105.

The central trench 150 is surrounded by the first to fourth gas supply regions 110, 120, 130 and 140. In more detail, the central trench 150 may be surrounded by the inner sidewall 110si of the first gas supply region 110, the inner sidewall 120si of the second gas supply region 120, the inner sidewall 130si of the third gas supply region 130 and the inner sidewall 140si of the fourth gas supply region 140. A bottom or base surface of the central trench 150 may be defined by the lower surface of the base plate 105.

The central trench 150 may be directly connected to or communicate with the first to fourth trenches 115, 125, 135 and 145 that are elongated in the radial direction. That is to say, each of the first to fourth trenches 115, 125, 135 and 145 may be directly connected to or communicate with the central trench 150.

The central trench 150 and the first to fourth trenches 115, 125, 135 and 145, which are directly connected to each other, may have the shape of, for example, a pinwheel, but aspects of the present inventive concept are not limited thereto.

The gas injection apparatus may include outer trenches 155 formed in a circumferential direction on the base plate 105. The outer trenches 155 may have, for example, a ring shape. The outer trenches 155 may be formed along the outer sidewall 110so of the first gas supply region 110, the outer sidewall 120so of the second gas supply region 120, the outer sidewall 130so of the third gas supply region 130 and the outer sidewall 140so of the fourth gas supply region 140.

The outer trenches 155 may be directly connected to or communicate with the first to fourth trenches 115, 125, 135 and 145 elongated in the radial direction. In addition, the outer trenches 155 may be connected to or communicate with the central trench 150 by way of the first to fourth trenches 115, 125, 135 and 145.

In the gas injection apparatus shown in FIGS. 4 and 5, the first to fourth jet holes 110h, 120h, 130h and 140h may be formed only on the lower surfaces 110u, 120u, 130u and 140u of the first to fourth gas supply regions 110, 120, 130 and 140.

For example, the source gas supplied from the first gas supply region 110, that is, the first source gas, may be sprayed only from the lower surface 110u of the first gas supply region 110 and the purge gas supplied from the fourth gas supply region 140 may be sprayed only from the lower surface 140u of the fourth gas supply region 140.

Figure 6A:
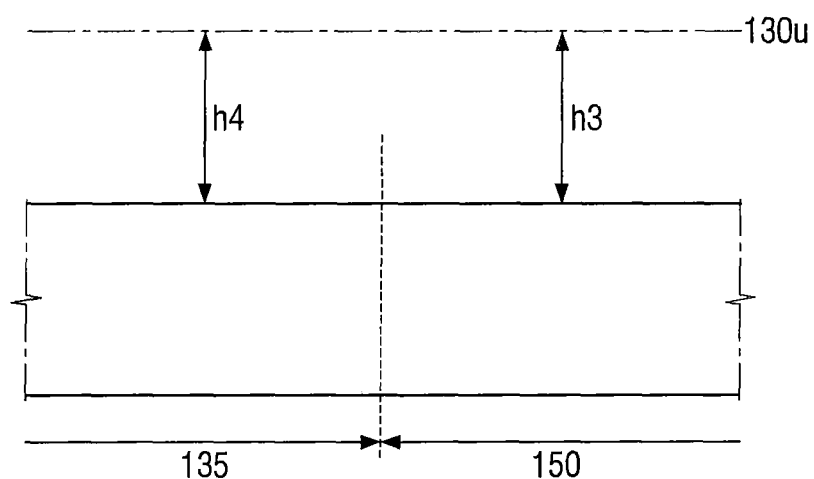
FIG. 6A is a cross-sectional view taken along the line D-D of FIG. 4 according to some embodiments.

Referring to FIGS. 4 and 6A, for example, a height h3 ranging from the bottom surface of the central trench 150 to the lower surface 130u of the third gas supply region 130 may be substantially equal to a height h4 ranging from the bottom surface of the third trench 135 to the lower surface 130u of the third gas supply region 130. That is to say, since a depth of each of the first to fourth trenches 115, 125, 135 and 145 is substantially equal to a depth of the central trench 150, thereby may be no step difference between the bottom surface of each of the first to fourth trenches 115, 125, 135 and 145 and the bottom surface of the central trench 150, but aspects of the present inventive concept are not limited thereto.

Figure 6B:
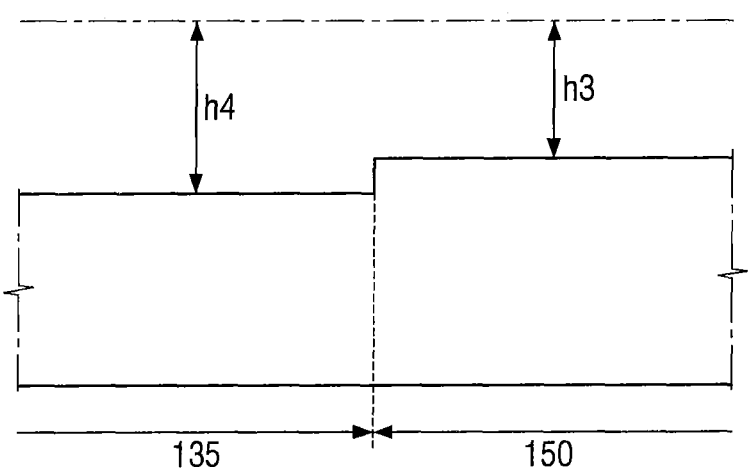
FIG. 6B is a cross-sectional view taken along the line D-D of FIG. 4 according to some other embodiments.

That is to say, as shown in FIG. 6B, there may be a step difference between each of the bottom surfaces of the first to fourth trenches 115, 125, 135 and 145 and the bottom surface of the central trench 150. For example, the height h3 ranging from the bottom surface of the central trench 150 to the lower surface 130u of the third gas supply region 130 may be smaller than the height h4 ranging from the bottom surface of the third trench 135 to the lower surface 130u of the third gas supply region 130. That is to say, the bottom surface of the third trench 135 may be recessed more than the bottom surface of the central trench 150.

In other words, the depth of each of the first to fourth trenches 115, 125, 135 and 145 may be greater than the depth of the central trench 150, but aspects of the present inventive concept are not limited thereto. Unlike in FIG. 6B, the depth of the central trench 150 may be greater than the depth of each of the first to fourth trenches 115, 125, 135 and 145.

Due to the step difference shown in FIG. 6B, conductance of each of the first to fourth trenches 115, 125, 135 and 145 may be larger than that of the central trench 150. Accordingly, gases that may remain in the central trench 150 may be rapidly exhausted to the first to fourth trenches 115, 125, 135 and 145. The conductance of each of the first to fourth trenches 115, 125, 135 and 145 will later be described in detail with reference to FIGS. 20 and 21.

In FIGS. 6A and 6B, the depth of the third trench 135 corresponding to a constant depth ranging from the central trench 150 to each of the outer trenches 155 is illustrated, which is provided only for the sake of convenient explanation, but aspects of the present inventive concept are not limited thereto. That is to say, the bottom surface of the third trench 135 may be an inclined surface between the central trench 150 and each of the outer trenches 155.

Another exemplary gas injection apparatus used in thin film deposition equipment according to embodiments of the present inventive concept will now be described with reference to FIG. 7. The following description will focus on differences between the gas injection apparatus shown in FIG. 7 and the gas injection apparatus shown in FIGS. 4 to 6.

Referring to FIG. 7, in the gas injection apparatus used in thin film deposition equipment according to embodiments of the present inventive concept, the first jet hole(s) 110$h$ may be formed on the lower surface 110$u$ of the first gas supply region 110 and the radial sidewalls 110$rs$ of the first gas supply region 110.

Likewise, the second jet hole(s) 120$h$ may be formed on the lower surface 120$u$ of the second gas supply region 120 and the radial sidewalls 120$rs$ of the second gas supply region 120, the third jet hole(s) 130$h$ may be formed on the lower surface 130$u$ of the third gas supply region 130 and the radial sidewalls 130$rs$ of the third gas supply region 130, and the fourth jet hole(s) 140$h$ may be formed on the lower surface 140$u$ of the fourth gas supply region 140 and the radial sidewalls 140$rs$ of the fourth gas supply region 140.

For example, the first source gas as the source gas may be sprayed from the lower surface 110$u$ of the first gas supply region 110 and the radial sidewalls 110$rs$ of the first gas supply region 110, and the purge gas supplied from the fourth gas supply region 140 may be sprayed from the lower surface 140$u$ of the fourth gas supply region 140 and the radial sidewalls 140$rs$ of the fourth gas supply region 140.

As described above, the first source gas is sprayed from each of the radial sidewalls 110$rs$ of the first gas supply region 110, thereby inhibiting or preventing the purge gas from penetrating into a reaction space between the first gas supply region 110 and the susceptor (300 of FIG. 2) and from diluting a concentration of the first source gas. In addition, the purge gas is sprayed from the radial sidewalls 140$rs$ of the fourth gas supply region 140, thereby suppressing the first source gas supplied from the first gas supply region 110 from being diffused into other areas.

Still another exemplary gas injection apparatus used in thin film deposition equipment according to embodiments of the present inventive concept will now be described with reference to FIGS. 8 and 9. The following description will focus on differences between the gas injection apparatus shown in FIGS. 8 and 9 and the gas injection apparatus shown in FIGS. 4 to 6.

Referring to FIGS. 8 and 9, the gas injection apparatus may further includes a first trench jet hole or aperture 115$h$ formed on a bottom or base surface of a first trench 115, a second trench jet hole or aperture 125$h$ formed on a bottom or base surface of a second trench 125, a third trench jet hole or aperture 135$h$ formed on a bottom or base surface of the third trench 135, and a fourth trench jet hole or aperture 145$h$ formed on a bottom or base surface of a fourth trench 145.

For example, a first part or portion of the fourth trench jet hole(s) 145$h$ formed on the bottom surface of the fourth trench 145 sprays the same purge gas with a gas sprayed from a fourth gas supply region 140. In addition, a second part or portion of the fourth trench jet hole(s) 145$h$ formed on the bottom surface of the fourth trench 145 sprays the same first source gas with a gas sprayed from a first gas supply region 110.

The first part of the fourth trench jet hole 145$h$ spraying the purge gas may be adjacent to the fourth gas supply region 140 and the second part of the fourth trench jet hole 145$h$ spraying the first source gas may be adjacent to the first gas supply region 110.

In other words, the gases sprayed from the first to fourth trench jet holes 115$h$, 125$h$, 135$h$ and 145$h$ may be the gases sprayed from the gas supply regions 110, 120, 130 and 140 adjacent to the first to fourth trench jet holes 115$h$, 125$h$, 135$h$ and 145$h$, but aspects of the present inventive concept are not limited thereto.

Since the gas supply regions adjacent to the first trench jet hole 115$h$ and the fourth trench jet hole 145$h$ are the first and second gas supply regions 110 and 120 supplying the first source gas and the purge gas and the fourth gas supply region 140 supplying the purge gas, the first trench jet hole 115$h$ and the fourth trench jet hole 145$h$ may spray the first source gas and the purge gas.

In addition, since the gas supply regions adjacent the second trench jet hole 125$h$ and the third trench jet hole 135$h$ are the third gas supply region 130 supplying the second source gas and the second and fourth gas supply regions 120 and 140 supplying the purge gas, the second trench jet hole 125$h$ and the third trench jet hole 135$h$ may supply the second source gas and the purge gas.

In FIG. 8, the fourth trench jet holes 145$h$ radially arranged in two lines are illustrated, which is provided only for the sake of convenient explanation, but aspects of the present inventive concept are not limited thereto.

Still another exemplary gas injection apparatus used in thin film deposition equipment according to embodiments of the present inventive concept will now be described with reference to FIGS. 10 and 11. The following description will focus on differences between the gas injection apparatus shown in FIGS. 10 and 11 and the gas injection apparatus shown in FIGS. 4 to 6.

Referring to FIGS. 10 and 11, in the gas injection apparatus, radius sidewalls 110$rs$ of the first gas supply region 110 may include a first lower sidewall 110$rs$-1, a first upper sidewall 110$rs$-2, and a first connecting surface or wall 110$rs$-3 connecting the first lower sidewall 110$rs$-1 and the first upper sidewall 110$rs$-2.

Radial sidewalls 140$rs$ of the fourth gas supply region 140 may include a fourth lower sidewall 140$rs$-1, a fourth upper sidewall 140$rs$-2, and a fourth connecting surface or wall 140$rs$-3 connecting the fourth lower sidewall 140$rs$-1 and the fourth upper sidewall 140$rs$-2.

Radial sidewalls 120rs of the second gas supply region 120 and radial sidewalls 130rs of the third gas supply region 130 may have structures similar to those of radial sidewalls 110rs of the first gas supply region 110 and radial sidewalls 140rs of the fourth gas supply region 140.

In FIG. 11, for example, sidewalls of the fourth trench 145 may be defined by the first lower sidewall 110rs-1, the first upper sidewall 110rs-2, the first connecting surface 110rs-3, the fourth lower sidewall 140rs-1, the fourth upper sidewall 140rs-2 and the fourth connecting surface 140rs-3.

Therefore, the radial sidewalls 110rs of the first gas supply region 110, the radial sidewalls 120rs of the second gas supply region 120, the radial sidewalls 130rs of the third gas supply region 130 and the radial sidewalls 140rs of the fourth gas supply region 140 may be formed, for example, stepwise.

In still another exemplary gas injection apparatus shown in FIG. 11, radial sidewalls 110rs, 120rs, 130rs and 140rs of the first to fourth gas supply regions 110, 120, 130 and 140 may have connecting surfaces, respectively. However, first to fourth jet holes 110h, 120h, 130h and 140h may be formed only on lower surfaces 110u, 120u, 130u and 140u of the first to fourth gas supply regions 110, 120, 130 and 140.

For example, the first source gas supplied from the first gas supply region 110 may be sprayed only from the lower surface 110u of the first gas supply region 110, and the purge gas supplied from the fourth gas supply region 140 may be sprayed only from the lower surface 140u of the fourth gas supply region 140.

Still another exemplary gas injection apparatus used in thin film deposition equipment according to embodiments of the present inventive concept will now be described with reference to FIG. 10 and FIG. 12. The following description will focus on differences between the gas injection apparatus shown in FIG. 12 and the gas injection apparatus shown in FIG. 10 and FIG. 11.

Referring to FIG. 12, in the gas injection apparatus, at least one first jet hole 110h may be formed on a first connecting surface or wall 110rs-3. In addition, at least one fourth jet hole 140h may be formed on a fourth connecting surface or wall 140rs-3.

Likewise, at least one second jet hole 120h and at least one third jet hole 130h may be formed on a connecting surface or wall of radial sidewalls 120rs of the second gas supply region 120 and a connecting surface or wall of radial sidewalls 130rs of the third gas supply region 130, respectively.

For example, the first source gas as the source gas may be sprayed from the lower surface 110u of the first gas supply region 110 and the first connecting surface 110rs-3, and the purge gas supplied from the fourth gas supply region 140 may be sprayed from the lower surface 140u of the fourth gas supply region 140 and the fourth connecting surface 140rs-3.

In other words, the first to fourth gas supply regions 110, 120, 130 and 140 may supply the source gas or the purge gas from the lower surfaces 110u, 120u, 130u and 140u of the first to fourth gas supply regions 110, 120, 130 and 140 and radial sidewalls 110rs, 120rs, 130rs and 140rs of the first to fourth gas supply regions 110, 120, 130 and 140.

Still another exemplary gas injection apparatus used in thin film deposition equipment according to embodiments of the present inventive concept will now be described with reference to FIGS. 13 and 14. The following description will focus on differences between the gas injection apparatus shown in FIGS. 13 and 14 and the gas injection apparatus shown in FIGS. 4 to 6.

Figure 14A:
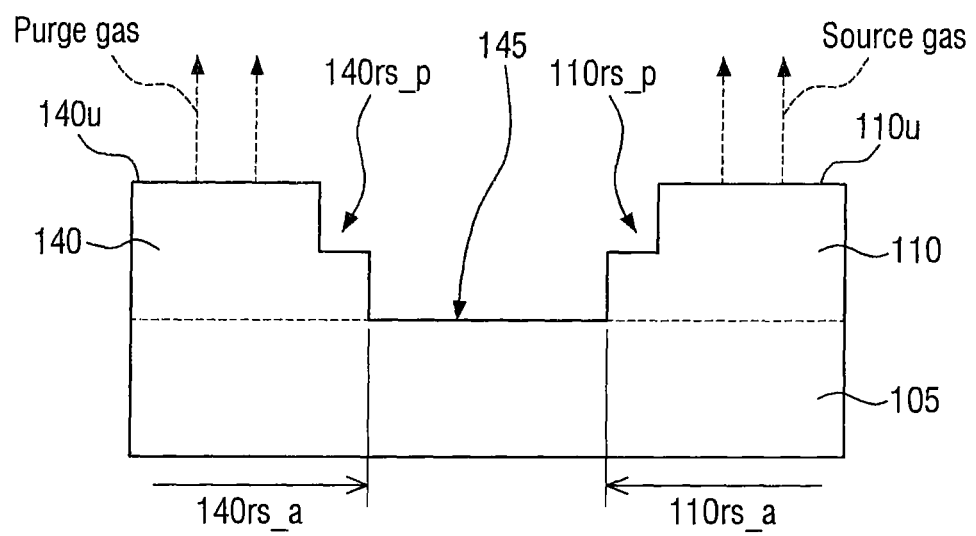
FIG. 14A is a cross-sectional view taken along the line E-E of FIG. 13.
Figure 14B:
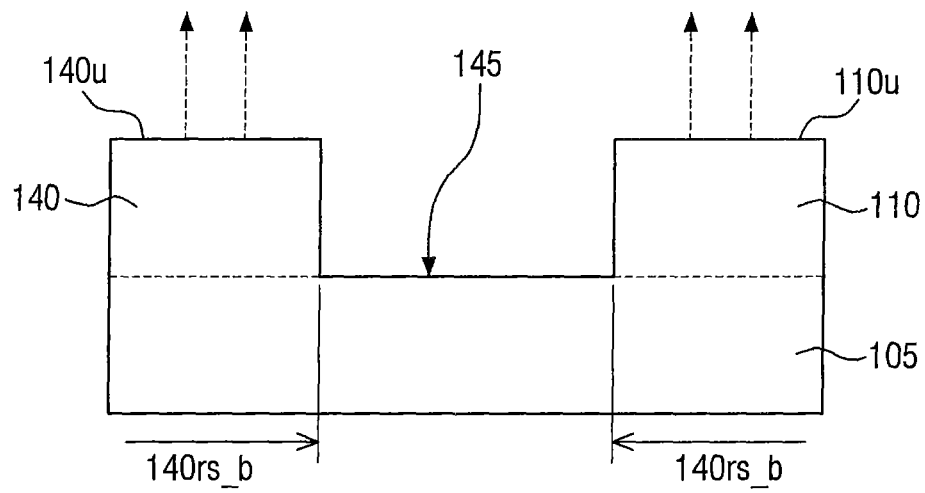
FIG. 14B is a cross-sectional view taken along the line F-F of FIG. 13.

Specifically, FIG. 14A is a cross-sectional view taken along the line E-E of FIG. 13 and FIG. 14B is a cross-sectional view taken along the line F-F of FIG. 13.

Referring to FIGS. 13 and 14, in the gas injection apparatus, a first gas supply region 110 includes one or more first dents or indentions 110rs_p.

The first dents 110rs_p may be formed at intersections of the lower surface 110u of the first gas supply region 110 and the radial sidewalls 110rs of the first gas supply region 110.

Likewise, the second gas supply region 120 may include one or more second dents or indentions 120rs_p, the third gas supply region 130 may include one or more third dents or indentions 130rs_p, and the fourth gas supply region 140 may include one or more fourth dents or indentions 140rs_p.

For example, sidewalls 110rs of the first gas supply region 110 may include first parts or portions 110rs_a where the first dents 110rs_p are formed and second parts or portions 110rs_b where the first dents 110rs_p are not formed. Here, the first parts 110rs_a of the sidewalls 110rs of the first gas supply region 110 may not have a continuous slope and may be formed, for example, stepwise. However, the second parts 110rs_b of the sidewalls 110rs of the first gas supply region 110 may have a continuous slope.

Likewise, sidewalls 140rs of the fourth gas supply region 140 may include first parts or portions 140rs_a where the fourth dents 140rs_p are formed and second parts or portions 140rs_b where the fourth dents 140rs_p are not formed. Here, the first parts 140rs_a of the sidewalls 140rs of the fourth gas supply region 140 may not have a continuous slope but the second parts 140rs_b of the sidewalls 140rs of the fourth gas supply region 140 may have a continuous slope.

Thin film deposition equipment according to another embodiment of the present inventive concept will now be described with reference to FIGS. 15 to 17. The following description will focus on differences between the thin film deposition equipment shown in FIGS. 15 to 17 and the thin film deposition equipment shown in FIGS. 1 to 6.

Figure 15:
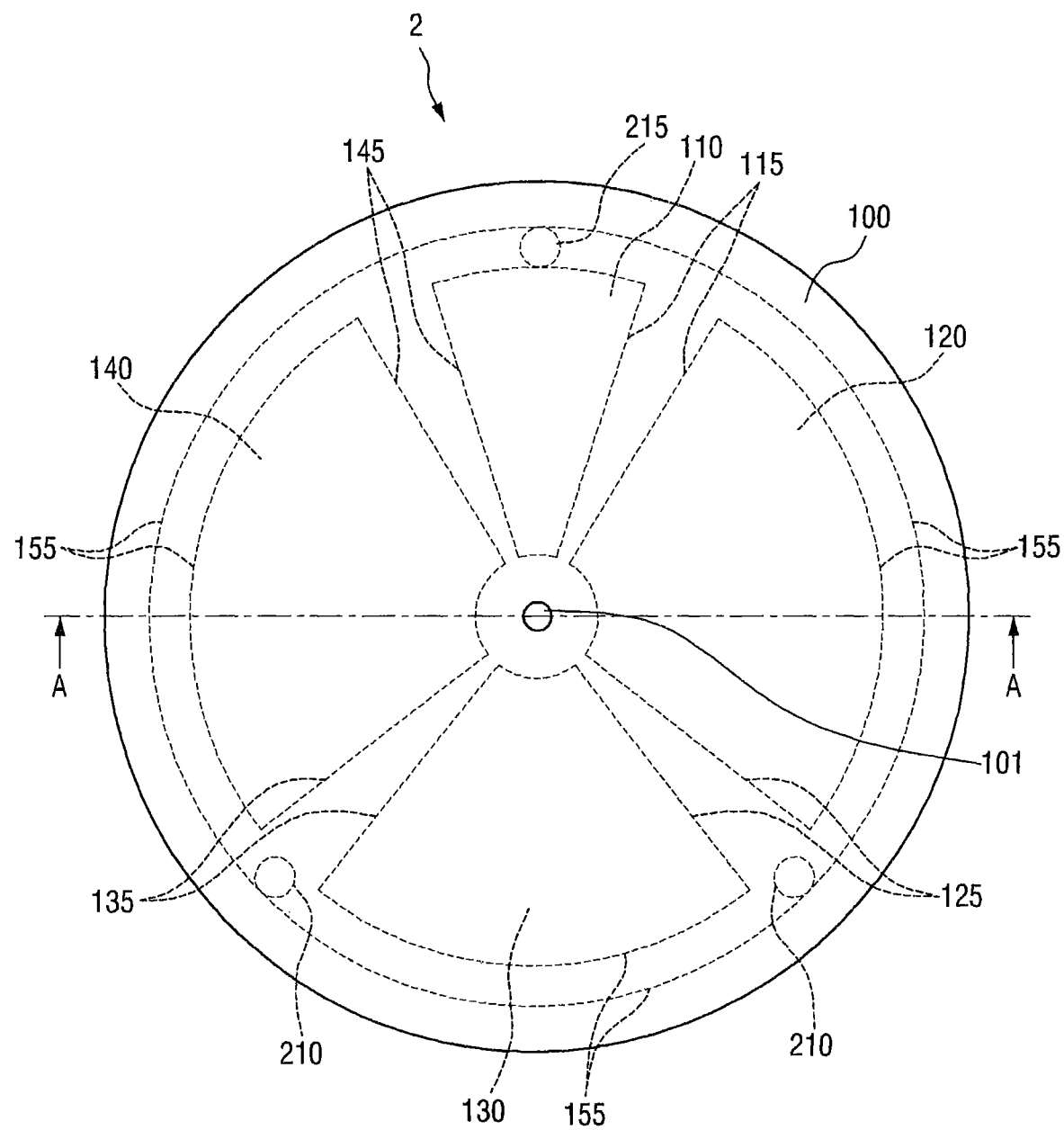
FIG. 15 is a schematic top view illustrating thin film deposition equipment according to another embodiment of the present inventive concept.
Figure 16:
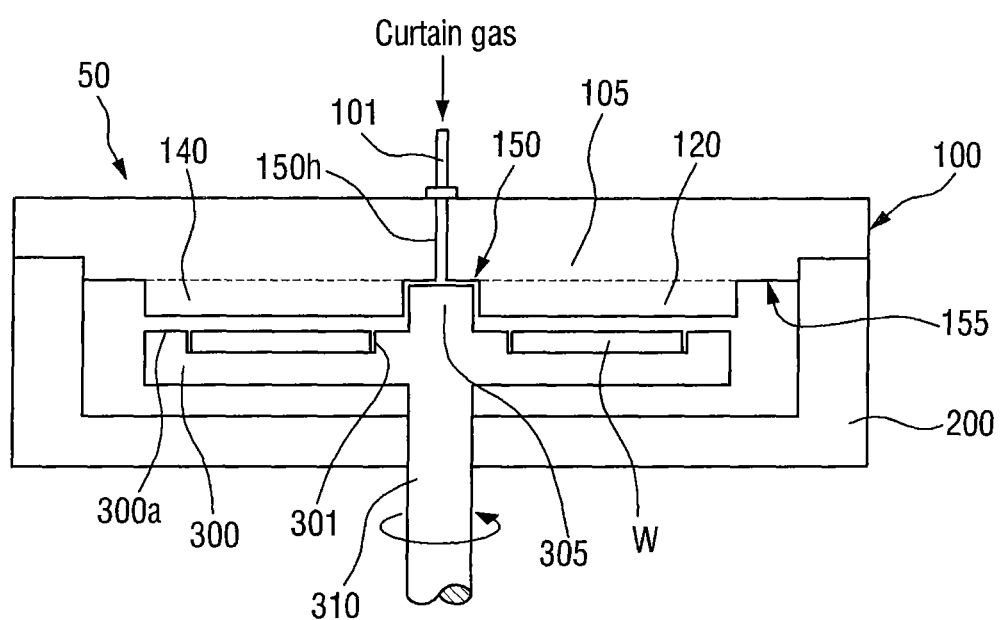
FIG. 16 is a cross-sectional view taken along the line A-A of FIG. 15.
Figure 17:
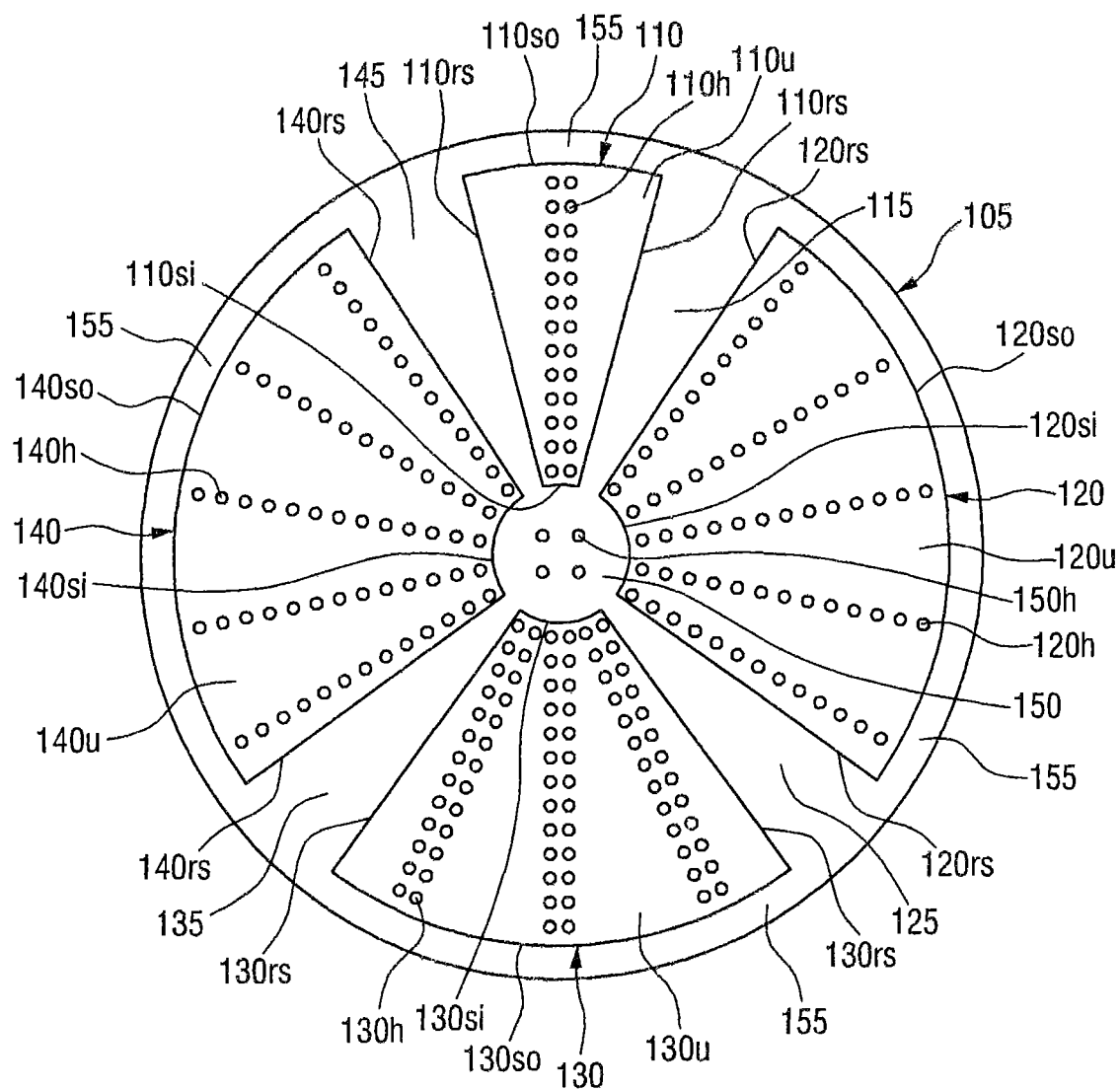
FIG. 17 is a top view illustrating still another exemplary gas injection apparatus used in thin film deposition equipment according to embodiments of the present inventive concept.

FIG. 15 is a schematic top view for explaining thin film deposition equipment according to another embodiment of the present inventive concept, FIG. 16 is a cross-sectional view taken along the line A-A of FIG. 15, and FIG. 17 is a schematic top view for explaining still another exemplary gas injection apparatus used in thin film deposition equipment according to embodiments of the present inventive concept.

Referring to FIGS. 15 to 17, the thin film deposition equipment 2 according to another embodiment of the present inventive concept may further include a curtain gas supply pipe 101 and a central jet hole or aperture 150h.

The curtain gas supply pipe 101 may be connected to the center of an upper plate 100 of a vacuum chamber 50. The curtain gas supply pipe 101 may supply a curtain gas to a space between the upper plate 100 and the core unit 305.

The curtain gas may prevent a first source gas supplied from a first gas supply region 110 and a second source gas supplied from a third gas supply region 130 from being diffused through the space between the upper plate 100 and the core unit 305. The curtain gas may prevent the first source gas and the second source gas from being intermixed.

That is to say, the curtain gas may perform a function similar to that of the purge gas supplied from the second gas supply region 120 and the fourth gas supply region 140.

A central jet hole 150h is formed on a bottom surface of the central trench 150. The central jet hole 150h sprays the curtain gas supplied from the curtain gas supply pipe 101 to the space between the upper plate 100 and the core unit 305.

In FIG. 16, the central jet hole 150h wholly passing through the upper plate 100 (e.g., as a passageway) is illustrated, which is provided only for the sake of convenient explanation, but aspects of the present inventive concept are not limited thereto. That is to say, the central jet hole 150h and the curtain gas supply pipe 101 may be connected to each other through a plurality of passageways formed in the upper plate 100.

The curtain gas supplied from the central jet hole 150h passes the space between the upper plate 100 and the core unit 305 but does not flow along the upper surface 300a of the susceptor 300 having a substrate W loaded thereon. The curtain gas supplied from the central jet hole 150h flows to a first pumping port 215 and/or a second pumping port 210 through first to fourth trenches 115, 125, 135 and 145 directly connected to a central trench 150.

As described above, the gas injection apparatus includes one or more trenches extending in a radial direction, thereby preventing concentrations of the first source gas and/or the second source gas from being diluted due to the curtain gas while preventing the first source gas supplied from the first gas supply region 110 and the second source gas supplied from the third gas supply region 130 from being intermixed.

Due to the lack of dilution of the source gas concentration, a processing failure, which may be generated in a portion of the substrate W adjacent to the core unit 305 may be reduced.

For the sake of convenient explanation, FIG. 17 illustrates the thin film deposition equipment further including the central jet hole 150h, compared to the thin film deposition equipment shown in FIG. 4, but aspects of the present inventive concept are not limited thereto. That is to say, the forming of the central jet hole may also be applied to the gas injection apparatuses shown in FIGS. 7 to 14.

Thin film deposition equipment according to still another embodiment of the present inventive concept will now be described with reference to FIGS. 18 and 19. The following description will focus on differences between the thin film deposition equipment shown in FIGS. 18 and 19 and the thin film deposition equipment shown in FIGS. 1 to 6.

Figure 18:
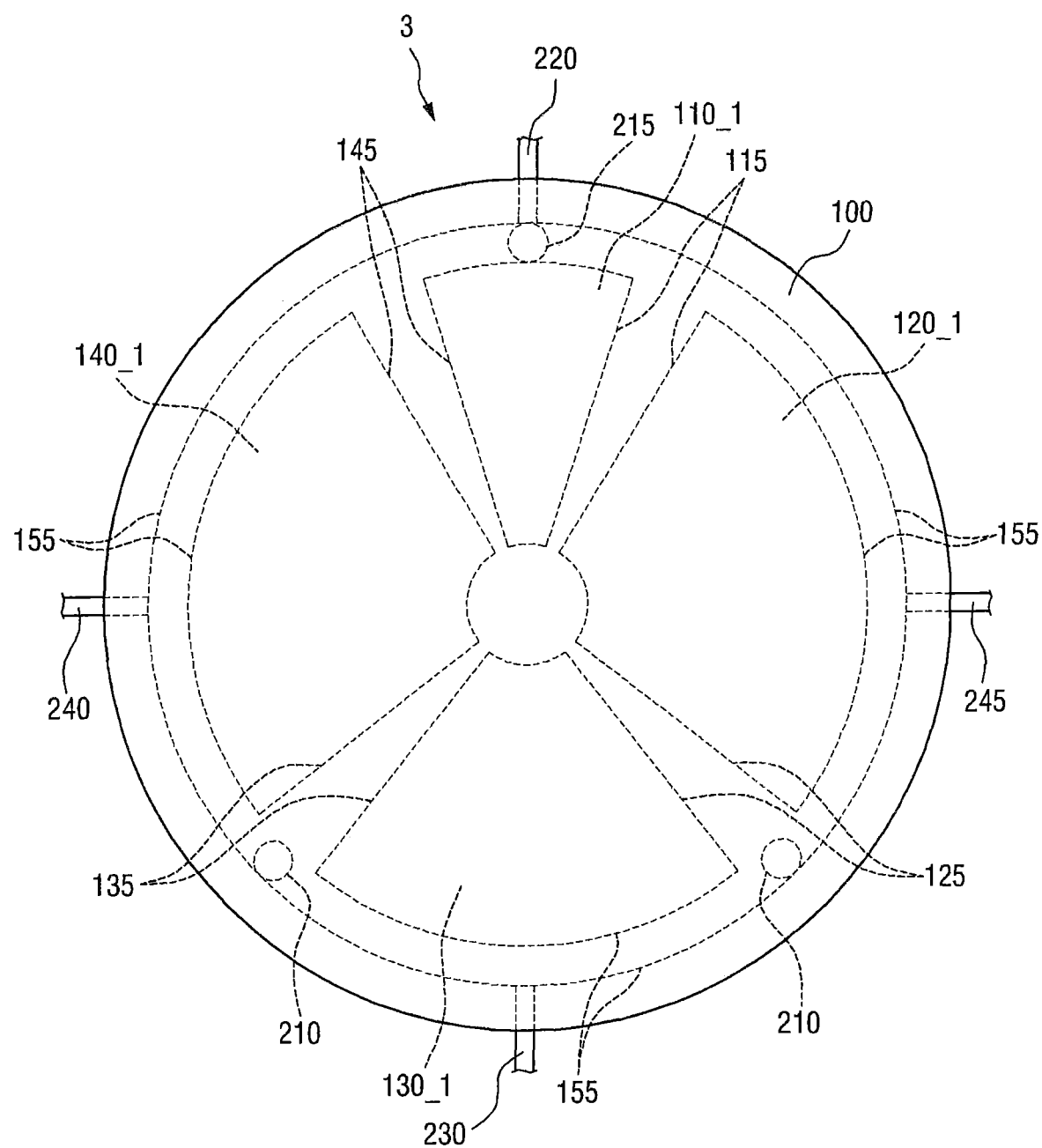
FIG. 18 is a schematic top view illustrating thin film deposition equipment according to still another embodiment of the present inventive concept.
Figure 19:
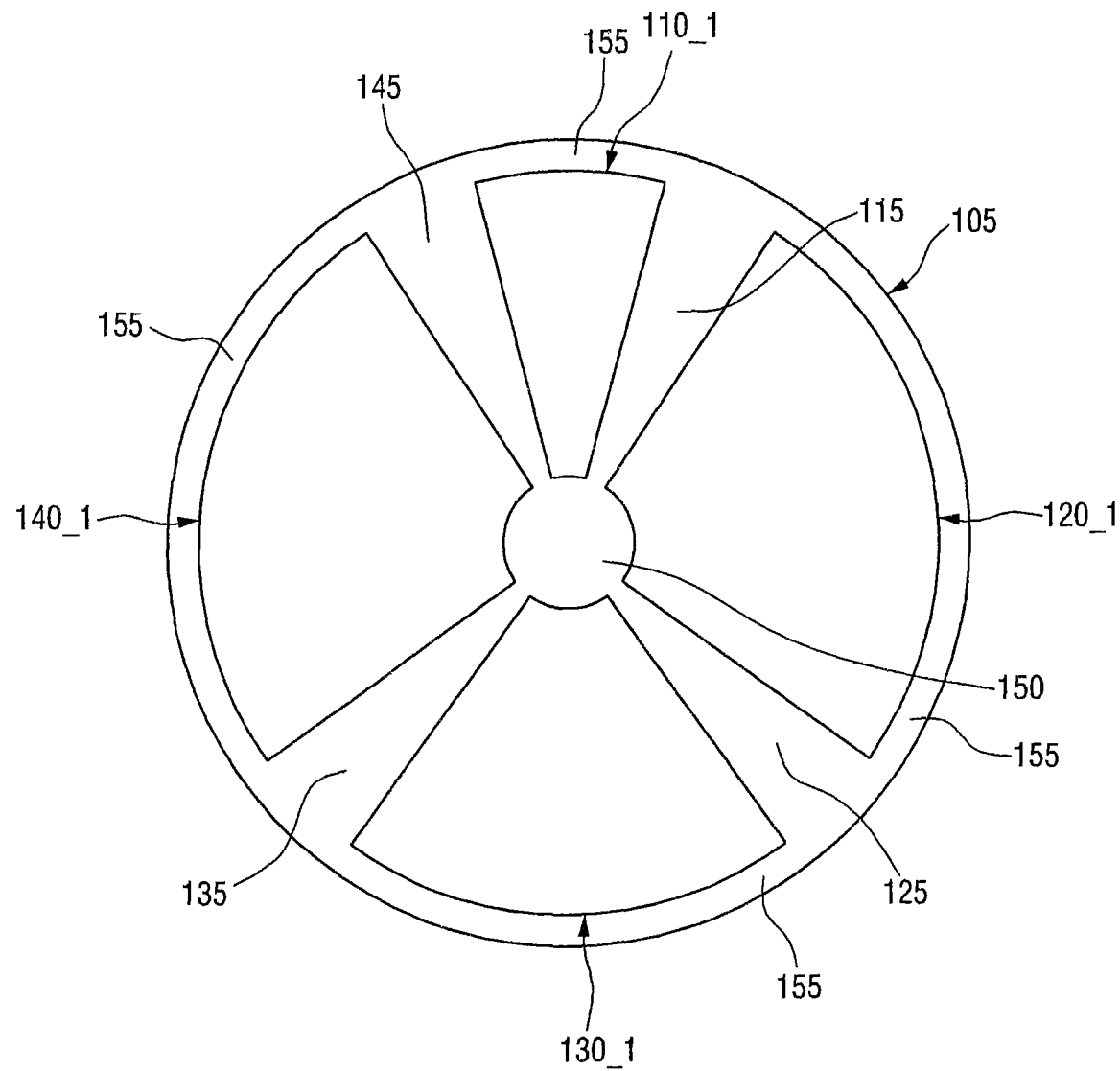
FIG. 19 is a top view illustrating still another exemplary gas injection apparatus used in thin film deposition equipment according to embodiments of the present inventive concept.

FIG. 18 is a schematic top view for explaining thin film deposition equipment according to still another embodiment of the present inventive concept and FIG. 19 is a top view for explaining still another exemplary gas injection apparatus used in thin film deposition equipment according to embodiments of the present inventive concept.

Here, the cross-sectional view of the thin film deposition equipment shown in FIG. 18 may be similar to that shown in FIG. 2, except for first to fourth gas ports 220, 230, 240 and 245.

Referring to FIGS. 18 and 19, the thin film deposition equipment 3 according to embodiments of the present inventive concept may further include first to fourth gas ports 220, 245, 230 and 240.

In addition, in the thin film deposition equipment 3 according to embodiments of the present inventive concept, an upper plate 100 does not include first to fourth gas supply regions 110, 120, 130 and 140. The upper plate 100 includes first to fourth protruding regions or member 110_1, 120_1, 130_1 and 140_1 without first to fourth jet holes 110h, 120h, 130h and 140h.

The first to fourth protruding regions 110_1, 120_1, 130_1 and 140_1 are substantially the same as the first to fourth gas supply regions 110, 120, 130 and 140 shown in FIG. 4, except that the first to fourth jet holes 110h, 120h, 130h and 140h are not provided, and therefore repeated descriptions thereof will not be given here in the interest of brevity.

The first gas port 220 may be disposed on a sidewall of a container body 200. The first gas port 220 supplies a first source gas as a source gas to a space between the first protruding region 110_1 and a susceptor 300.

The third gas port 230 may be disposed on a sidewall of the container body 200. The third gas port 230 supplies a second source gas as a source gas to a space between the third protruding region 130_1 and the susceptor 300.

The second gas port 245 may be disposed on a sidewall of the container body 200. The second gas port 245 supplies a purge gas to a space between the second protruding region 120_1 and the susceptor 300. In addition, the fourth gas port 240 may be disposed on a sidewall of the container body 200. The fourth gas port 240 supplies the purge gas to a space between the fourth protruding region 140_1 and the susceptor 300.

The thin film deposition equipment shown in FIGS. 1 to 6 and the thin film deposition equipment shown in FIGS. 18 and 19 are different from each other in view of whether the first source gas, the second source gas and the purge gas are supplied from the upper plate 100 or from the sidewalls of the container body 200.

For brevity, unlike in FIG. 4, the thin film deposition equipment without the first to fourth jet holes 110h, 120h, 130h and 140h is illustrated in FIG. 19, but aspects of the present inventive concept are not limited thereto. That is to say, the forming of the first to fourth jet holes 110h, 120h, 130h and 140h may also be applied to the gas injection apparatus shown in FIG. 19.

Figure 20:
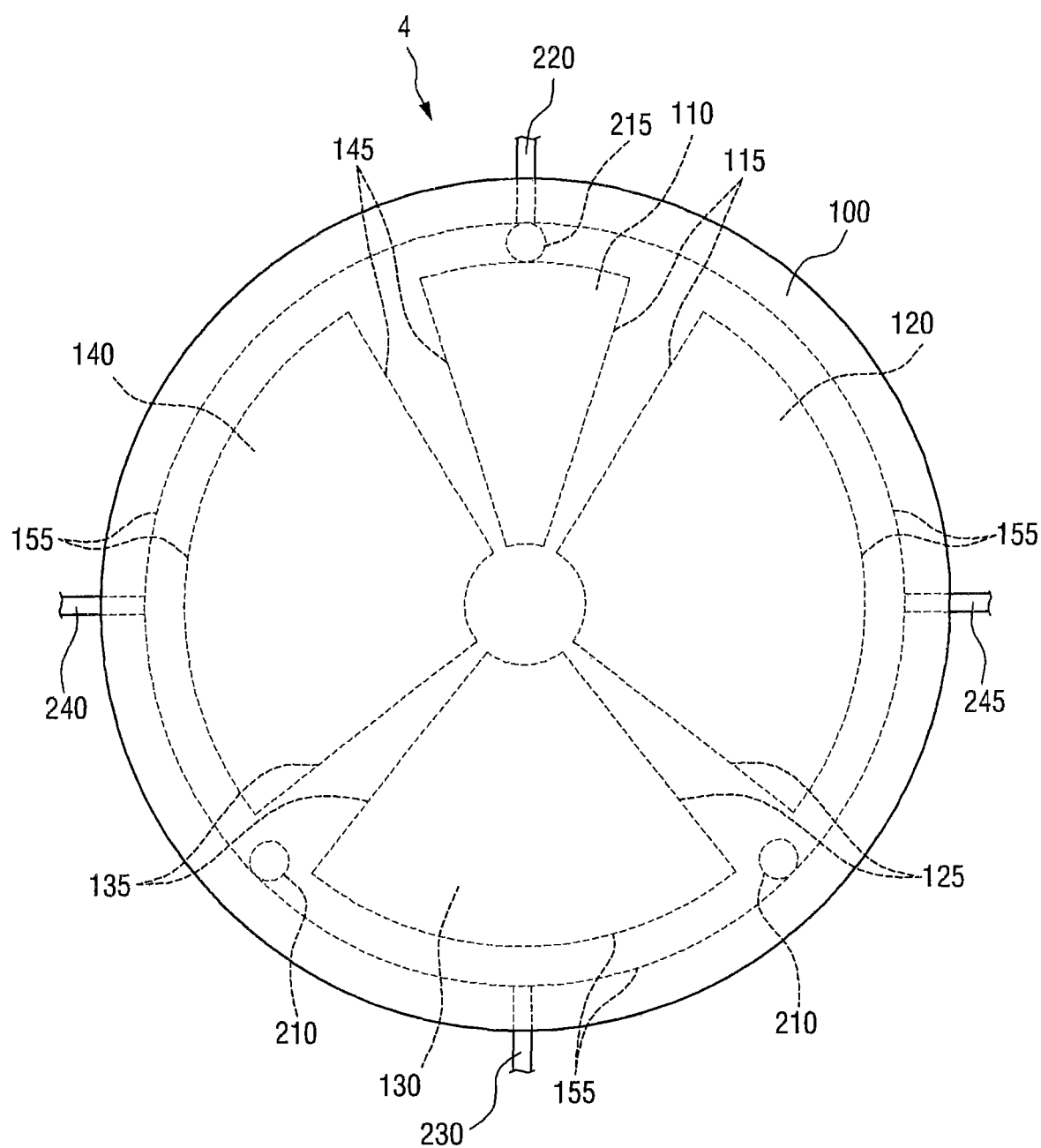
FIG. 20 is a schematic top view illustrating thin film deposition equipment according to still another embodiment of the present inventive concept.

FIG. 20 is a schematic top view for explaining thin film deposition equipment according to still another embodiment of the present inventive concept. For the sake of convenient explanation, the following description will focus on differences between the thin film deposition equipment shown in FIG. 20 and the thin film deposition equipment shown in FIGS. 1 to 6.

Referring to FIG. 20, the thin film deposition equipment 3 according to still another embodiment of the present inventive concept further includes first to fourth gas ports 220, 245, 230 and 240.

The first gas port 220 may be formed on a sidewall of a container body 200. The first gas port 220 supplies a first source gas as a source gas to a space between the first protruding region 110_1 and the susceptor 300 (see FIG. 2).

The third gas port 230 may be formed on a sidewall of the container body 200. The third gas port 230 supplies a second source gas as a source gas to a space between the third protruding region 130_1 and the susceptor 300.

The second gas port 245 may be formed on a sidewall of the container body 200. The second gas port 245 supplies a purge gas to a space between the second protruding region 120_1 and the susceptor 300. In addition, the fourth gas port 240 may be formed on a sidewall of the container body 200. The fourth gas port 240 supplies the purge gas to a space between the fourth protruding region 140_1 and the susceptor 300.

Hereinafter, effects of a gas injection apparatus according to the present inventive concept will be described with reference to FIGS. 21 and 22.

Figure 21:
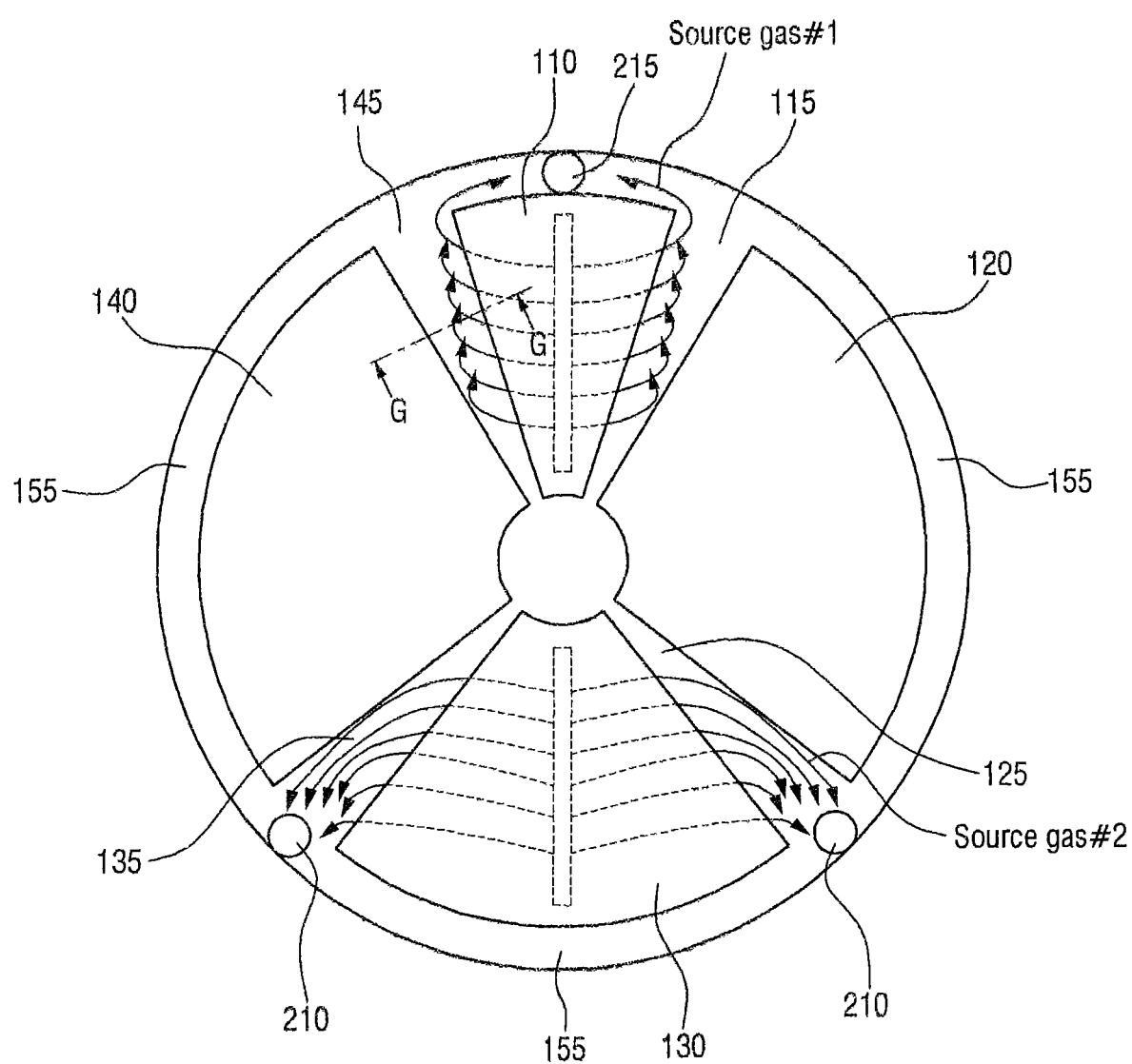
FIGS. 21 and 22 illustrate effects of the present inventive concept.
Figure 22:
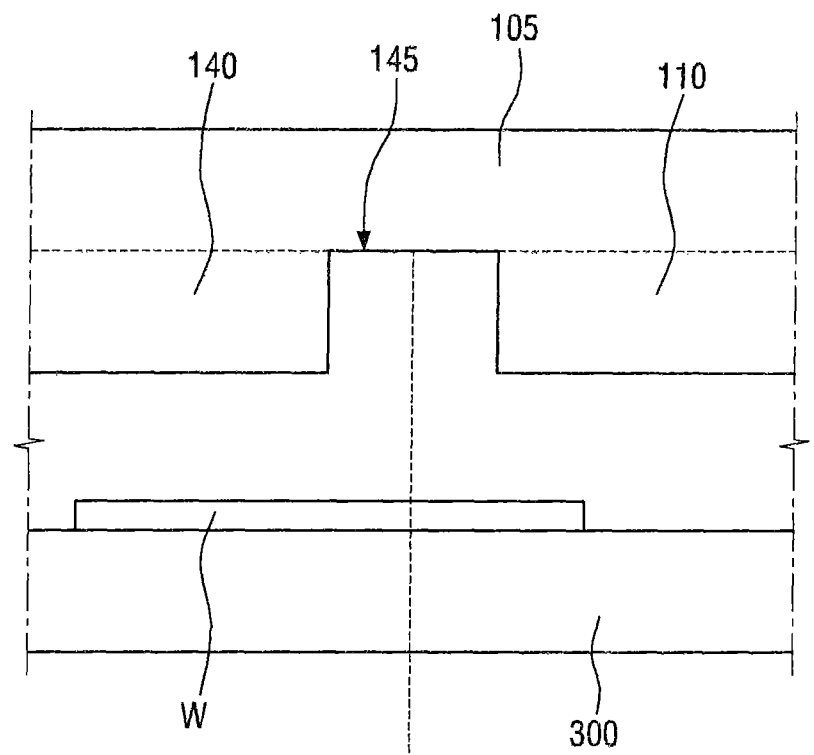
Figure 22:
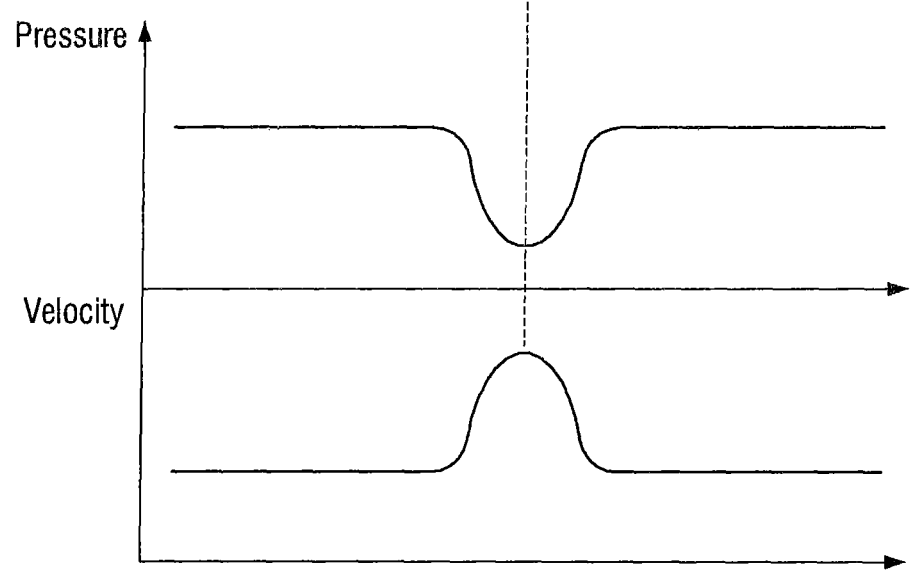

FIGS. 21 and 22 illustrate effects of a gas injection apparatus according to the present inventive concept. Specifically, FIG. 21 schematically illustrates flow of a first source gas and a second source gas in vicinity of the gas injection apparatus. FIG. 22 illustrates changes in the pressure and flow rate in the cross-sectional view taken along the line G-G of FIG. 21.

The first source gas (source gas #1) supplied from the first gas supply region 110 is diffused between the first gas supply region 110 and the susceptor (300 of FIG. 2). Since the susceptor 300 rotates, the first source gas is wholly supplied to a substrate W loaded on the susceptor 300.

Likewise, the second source gas (source gas #2) supplied from the third gas supply region 130 is diffused between the third gas supply region 130 and the susceptor (300 of FIG. 2). Since the susceptor 300 rotates, the second source gas is wholly supplied to the substrate W loaded on the susceptor 300.

It is assumed that the susceptor 300 rotates counterclockwise. As the susceptor 300 rotates, the supplied first source gas supplied to the substrate W positioned under the first gas supply region 110 enter a lower portion of the fourth trench 145.

If the first source gas supplied to a space between the first gas supply region 110 and the substrate W enters the lower portion of the fourth trench 145, the pressure applied to the first source gas is sharply reduced.

In more detail, assuming that the first source gas is an ideal gas, while the mole of the first source gas staying on the substrate W is maintained at a constant level, there may be an increase in the volume of the substrate W in which the first source gas may stay, which is because a distance between the first gas supply region 110 and the substrate W is less than a distance between a bottom surface of the fourth trench 145 and the substrate W.

Therefore, according to the increase in the volume of the substrate W in which the first source gas may stay, the pressure of the first source gas may be reduced. Therefore, as shown in FIG. 22, when the substrate W passes the lower portion of the fourth trench 145, the pressure of the first source gas is sharply reduced.

If the pressure of the first source gas is sharply reduced, the flow rate of the first source gas sharply increases based on the Bernoulli's equation.

As described above, as the first source gas moves from the space between the first gas supply region 110 and the substrate W, which is relatively narrow, to the space between the fourth trench 145 and the substrate W, which is relatively wide, the flow rate of the first source gas increases, so that the first source gas is rapidly absorbed into the first pumping port 215.

In other words, conductance of the space between the fourth trench 145 and the substrate W is larger than that of the space between the first gas supply region 110 and the substrate W. A fluid tends to move to a space having large conductance, that is, a space having small resistance against the moving of the fluid. Therefore, the first source gas is not diffused to the space between the fourth gas supply region 140 and the substrate W but is exhausted to the first pumping port 215 through the fourth trench 145 and outer trenches 155.

Occurrence of this phenomenon may be applied to the second source gas as well as to the first source gas, and the second source gas is also rapidly absorbed into the second pumping port 210 through the second trench 125 or the third trench 135. In addition, the purge gas is not diffused to the first gas supply region 110 or the third gas supply region 130 but is rapidly absorbed into the first pumping port 215 and/or the second pumping port 210.

Therefore, it is possible to prevent the first source gas and the second source gas from being intermixed and spaces of the first source gas and the second source gas can be distinctly partitioned.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. Thin film deposition equipment comprising:
   a vacuum chamber including an upper plate and a chamber body, the upper plate including a gas injection apparatus; and
   a susceptor rotatably installed in the vacuum chamber, the susceptor having an upper surface including a substrate loading portion,
   wherein the upper plate includes:
   a base plate facing the susceptor, the base plate including a lower surface facing the upper surface of the susceptor;
   a first gas supply region protruding from the lower surface of the base plate and configured to supply a first source gas to the upper surface of the susceptor;
   a second gas supply region protruding from the lower surface of the base plate and configured to supply a purge gas to the upper surface of the susceptor;
   a third gas supply region protruding from the lower surface of the base plate and configured to supply a second source gas to the upper surface of the susceptor;
   a fourth gas supply region protruding from the lower surface of the base plate and configured to supply the purge gas to the upper surface of the susceptor;
   a first trench defined by a sidewall of the first gas supply region and a sidewall of the second gas supply region;
   a second trench defined by a sidewall of the second gas supply region and a sidewall of the third gas supply region;
   a third trench defined by a sidewall of the third gas supply region and a sidewall of the fourth gas supply region; and
   a fourth trench defined by a sidewall of the fourth gas supply region and a sidewall of the first gas supply region,
   wherein the first to fourth gas supply regions are sequentially disposed in a circumferential direction on the base plate and the first to fourth trenches are elongated in a radial direction on the base plate, and
   wherein the susceptor includes a centrally protruding core unit, the upper plate includes a central trench surrounded by the first to fourth gas supply regions and having a bottom surface defined by the base plate, and the core unit is received in the central trench.

2. The thin film deposition equipment of claim 1, wherein the first to fourth trenches are directly connected to the central trench.

3. The thin film deposition equipment of claim 2, wherein bottom surfaces of the first to fourth trenches and the bottom surface of the central trench are coplanar.

4. The thin film deposition equipment of claim 2, wherein bottom surfaces of the first to fourth trenches are offset from the bottom surface of the central trench.

5. The thin film deposition equipment of claim 1, wherein the upper plate further includes a central jet hole formed on the bottom surface of the central trench and the central jet hole is configured to supply a curtain gas for preventing the first source gas and the second source gas from being intermixed.

6. Thin film deposition equipment comprising:
a vacuum chamber including an upper plate and a container body; and
a susceptor rotatably installed in the vacuum chamber, the susceptor comprising an upper surface including a substrate loading portion,
wherein the upper plate includes:
a base plate facing the susceptor and including a lower surface facing the upper surface of the susceptor;
first to fourth protruding regions that protrude from the lower surface of the base plate such that lower surfaces of the first to fourth protruding regions are closer to the susceptor than the lower surface of the base plate, the first to fourth protruding regions being sequentially disposed in a circumferential direction on the base plate;
a first gas port disposed at a sidewall of the container body that is configured to supply a first source gas to a space between the first protruding region and the susceptor;
a second gas port disposed at a sidewall of the container body that is configured to supply a purge gas to a space between the second protruding region and the susceptor;
a third gas port disposed at a sidewall of the container body that is configured to supply a second source gas to a space between the third protruding region and the susceptor;
a fourth gas port disposed at a sidewall of the container body that is configured to supply the purge gas to a space between the fourth protruding region and the susceptor;
a first trench defined by a sidewall of the first protruding region and a sidewall of the second protruding region;
a second trench defined by a sidewall of the second protruding region and a sidewall of the third protruding region;
a third trench defined by a sidewall of the third protruding region and a sidewall of the fourth protruding region; and
a fourth trench defined by a sidewall of the fourth protruding region and a sidewall of the first protruding region, wherein the first to fourth trenches are elongated in a radial direction on the base plate, and
wherein the susceptor includes a centrally protruding core unit, the upper plate includes a central trench surrounded by the first to fourth protruding regions and having a bottom surface defined by the base plate, and the core unit is received in the central trench.

7. The thin film deposition equipment of claim 6, further comprising:
a first jet hole formed on the lower surface of the first protruding region and configured to supply the first source gas;
a second jet hole formed on the lower surface of the second protruding region and configured to supply the purge gas;
a third jet hole formed on the lower surface of the third protruding region and configured to supply the second source gas; and
a fourth jet hole formed on the lower surface of the fourth protruding region and configured to supply the purge gas.

8. The thin film deposition equipment of claim 6, further comprising a first pumping port and a second pumping port disposed in the container body and disposed around an outer periphery of the susceptor,
wherein the first pumping port is configured to absorb the first source gas and the second pumping port is configured to absorb the second source gas.

9. The thin film deposition equipment of claim 6, wherein the first to fourth trenches each have a bottom surface defined by the lower surface of the base plate.

10. The thin film deposition equipment of claim 9, wherein the first to fourth trenches are directly connected to the central trench.

* * * * *